United States Patent
Han et al.

(10) Patent No.: US 9,406,873 B2
(45) Date of Patent: Aug. 2, 2016

(54) MAGNETIC MEMORY DEVICE AND METHOD OF FABRICATING THE SAME

(71) Applicants: Shinhee Han, Seongnam-si (KR); Daeeun Jeong, Yongin-si (KR); Yong Kwan Kim, Yongin-si (KR); Yoonjong Song, Hwaseong-si (KR)

(72) Inventors: Shinhee Han, Seongnam-si (KR); Daeeun Jeong, Yongin-si (KR); Yong Kwan Kim, Yongin-si (KR); Yoonjong Song, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/319,563

(22) Filed: Jun. 30, 2014

(65) Prior Publication Data
US 2015/0035096 A1     Feb. 5, 2015

(30) Foreign Application Priority Data
Aug. 5, 2013   (KR) .................... 10-2013-0092688

(51) Int. Cl.
*H01L 21/02*    (2006.01)
*H01L 43/08*    (2006.01)
*H01L 27/22*    (2006.01)

(52) U.S. Cl.
CPC ............ *H01L 43/08* (2013.01); *H01L 27/228* (2013.01)

(58) Field of Classification Search
USPC .............. 257/295, E29.323; 365/159; 438/3
See application file for complete search history.

(56) References Cited

U.S. PATENT DOCUMENTS

| | | | |
|---|---|---|---|
| 6,992,342 B2 | 1/2006 | Motoyoshi et al. | |
| 7,362,607 B2 | 4/2008 | Motoyoshi | |
| 7,529,113 B2 * | 5/2009 | Ueda et al. | 365/63 |
| 8,158,445 B2 * | 4/2012 | Ryu et al. | 438/3 |
| 8,203,193 B2 | 6/2012 | Kajiyama et al. | |
| 8,355,272 B2 * | 1/2013 | Andre | 365/148 |
| 8,405,173 B2 * | 3/2013 | Kim et al. | 257/421 |
| 8,829,580 B2 * | 9/2014 | Sugiura et al. | 257/295 |
| 2004/0113175 A1 | 6/2004 | Motoyoshi et al. | |
| 2005/0237791 A1 | 10/2005 | Motoyoshi | |
| 2006/0139818 A1 * | 6/2006 | Inaba et al. | 360/324.12 |
| 2007/0268733 A1 * | 11/2007 | Ueda et al. | 365/63 |
| 2008/0062580 A1 * | 3/2008 | Inokuchi | B82Y 25/00 360/324.2 |
| 2011/0037108 A1 | 2/2011 | Sugiura et al. | |
| 2011/0049655 A1 | 3/2011 | Assefa et al. | |
| 2011/0111532 A1 * | 5/2011 | Ryu et al. | 438/3 |
| 2011/0248365 A1 | 10/2011 | Kajiyama et al. | |
| 2011/0303996 A1 * | 12/2011 | Kim et al. | 257/421 |
| 2012/0163061 A1 * | 6/2012 | Andre | 365/66 |
| 2012/0199895 A1 | 8/2012 | Nitta | |
| 2012/0211720 A1 | 8/2012 | Kang et al. | |
| 2015/0021675 A1 * | 1/2015 | Min | 257/295 |

FOREIGN PATENT DOCUMENTS

KR          101095080 B     12/2009

* cited by examiner

*Primary Examiner* — Telly Green
(74) *Attorney, Agent, or Firm* — Renaissance IP Law Group LLP

(57) ABSTRACT

Provided are a magnetic memory device and a method of fabricating the same. The device may include a cell selection device, a magnetic tunnel junction (MTJ), and a lower electrode connecting them. The lower electrode may include a vertical portion and a horizontal portion laterally extending from a side surface of the vertical portion. In the lower electrode, the vertical portion has a top surface higher than the horizontal portion and has a top surface including at least two parallel sides and other side at an angle thereto. The MTJ may be provided on the vertical portion of the lower electrode.

13 Claims, 28 Drawing Sheets

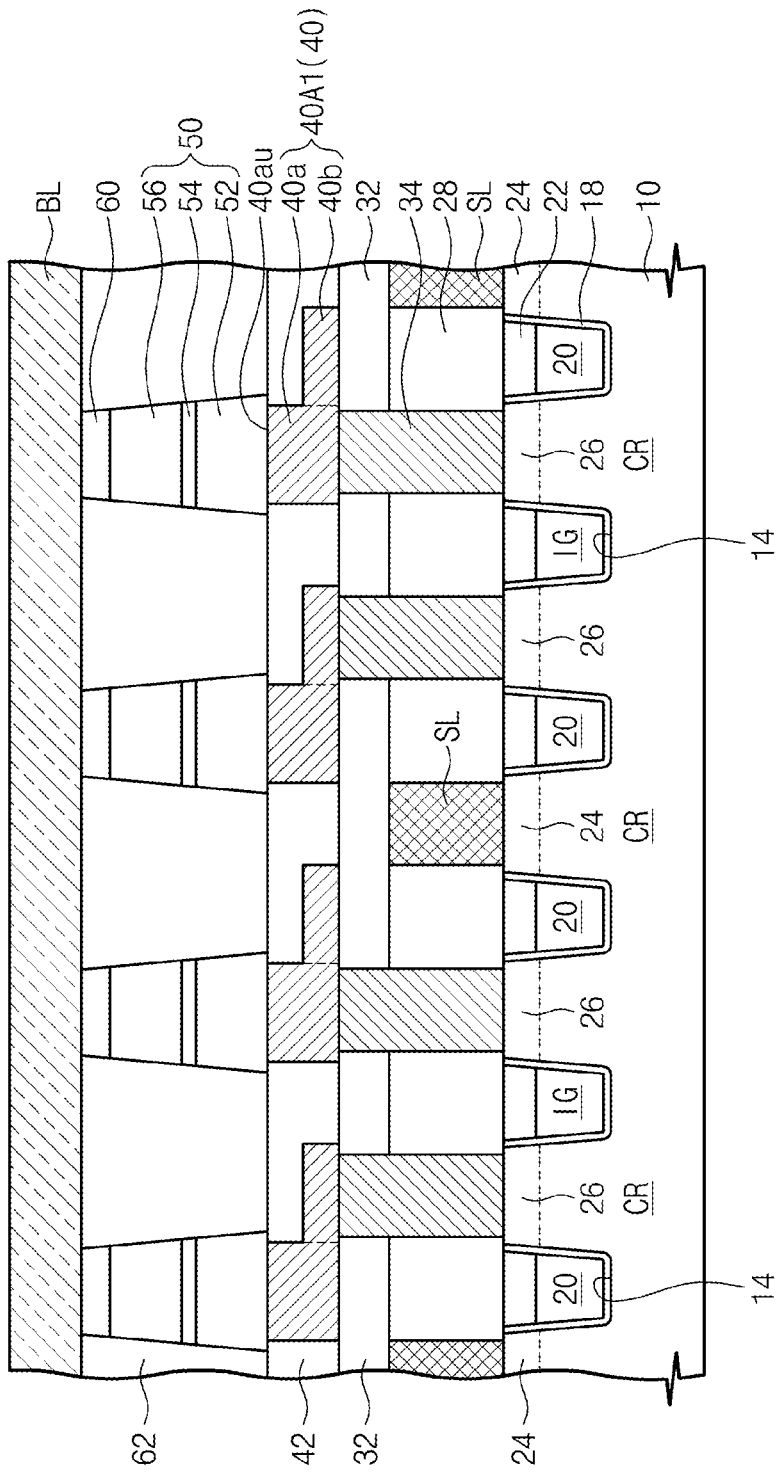

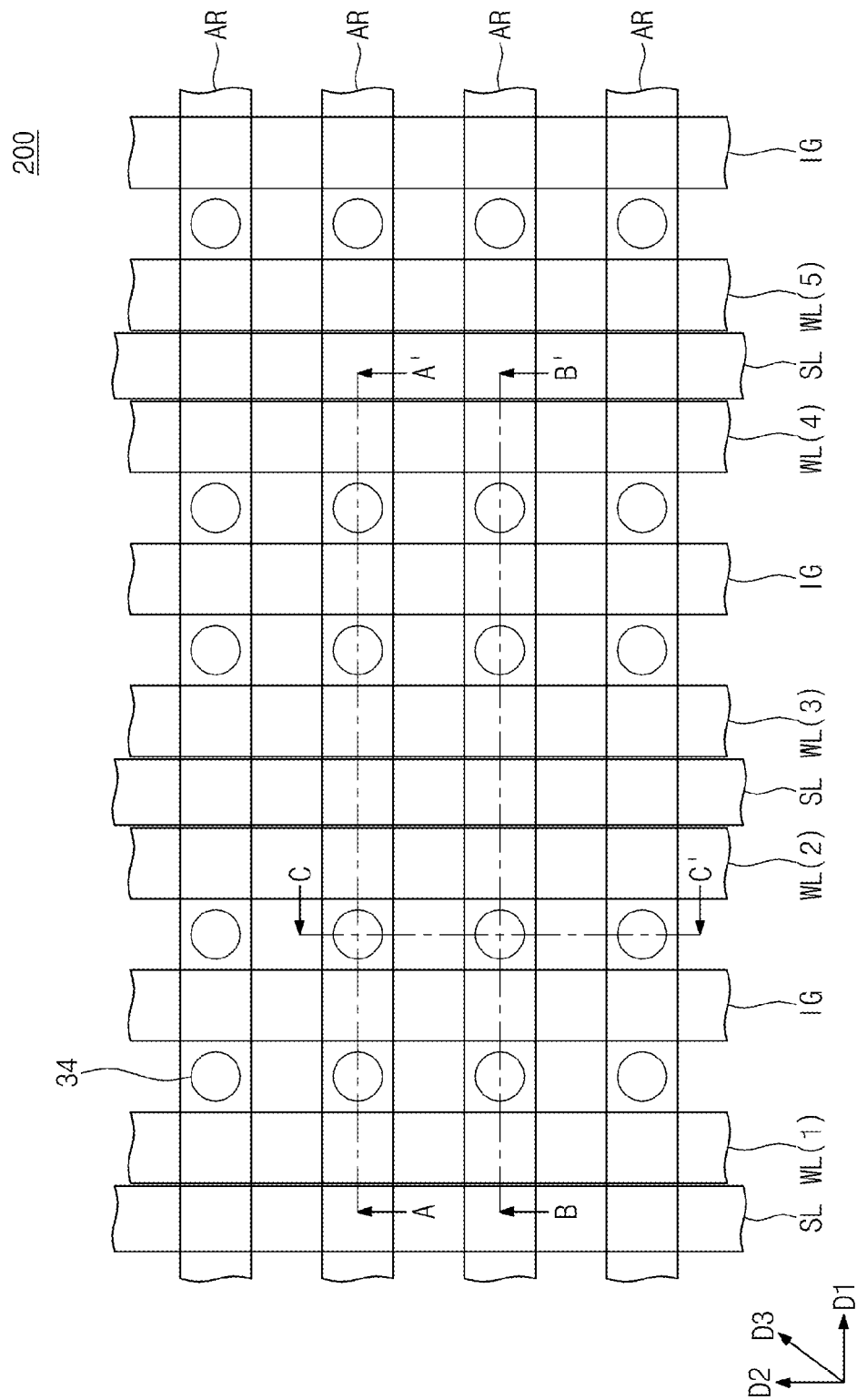

MAGNETIC MEMORY DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0092688, filed on Aug. 5, 2013, in the Korean Intellectual Property Office, the entire contents of which are hereby incorporated by reference.

BACKGROUND

Example embodiments of the inventive concept relate to a semiconductor device and a method of fabricating the same, and in particular, to a magnetic memory (MRAM) device and a method of fabricating the same.

Semiconductor devices are regarded as an important element in the electronics industry because of their small-size, multi-function capabilities, and/or low manufacturing costs. In particular, there is an increasing need for high-density nonvolatile memory devices with low power consumption. Since magnetic memory devices are expected to satisfy the aforementioned technical needs, there have been extensive studies with respect to magnetic memory devices.

SUMMARY

Example embodiments of the inventive concept provide a magnetic memory device with increased density and improved reliability.

Other example embodiments of the inventive concept provide a method of fabricating a magnetic memory device with increased density and improved reliability.

According to example embodiments of the inventive concept, a magnetic memory device may include a selection device, a lower electrode, which is connected to the selection device to include a vertical portion and a horizontal portion, a magnetic tunnel junction (MTJ), which is connected to the lower electrode to include a fixed layer, a tunnel barrier, and a free layer, and an upper electrode connected to the MTJ. The vertical portion of the lower electrode has a top surface that is higher than that of the horizontal portion and includes at least first and second sides substantially parallel to each other and a third side arranged at an angle with respect to the first and second sides.

According to example embodiments of the inventive concept, a magnetic memory device may include a plurality of word lines, a plurality of bit lines crossing the word lines, lower electrodes, which are arranged two-dimensionally below the bit lines and on the word lines, and each of which includes vertical and horizontal portions having different thicknesses from each other, MTJs provided on the vertical portions of the lower electrodes, respectively, and upper electrodes provided on the MTJs, respectively. The lower electrodes may include first-type lower electrodes positioned below odd-numbered ones of the bit lines and second-type lower electrodes positioned below even-numbered ones of the bit lines, and when viewed in plan view, centers of the vertical portions of the first-type lower electrodes may be overlapped with odd-numbered ones, respectively, of the word lines, and centers of the vertical portions of the second-type lower electrodes may be spaced apart from the odd-numbered ones of the word lines.

According to example embodiments of the inventive concept, a magnetic memory device may include a semiconductor substrate having an impurity region, a lower electrode electrically coupled to the impurity region, an MTJ connected to the lower electrode, and an upper electrode connected to the MTJ. The lower electrode has one portion whose top surface is placed higher than a top surface of another portion thereof, and the top surface of the lower electrode includes at least first and second sides substantially parallel to each other and a third side arranged at an angle with respect to the first and second sides.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2B, 2C, and 2D are cross-sectional views taken along lines A-A', B-B', and C-C', respectively, of FIG. 2A.

FIGS. 6A through 10A are plan views illustrating a method of fabricating a magnetic memory device, according to example embodiments of the inventive concept.

FIGS. 8B through 10B are cross-sectional views taken along dotted lines dotted lines A-A' of FIGS. 8A through 10A, respectively.

FIGS. 8C through 10C are cross-sectional views taken along dotted lines dotted lines B-B' of FIGS. 8A through 10A, respectively.

FIGS. 8D through 10D are cross-sectional views taken along dotted lines dotted lines C-C' of FIGS. 8A through 10A, respectively.

Figure 1:
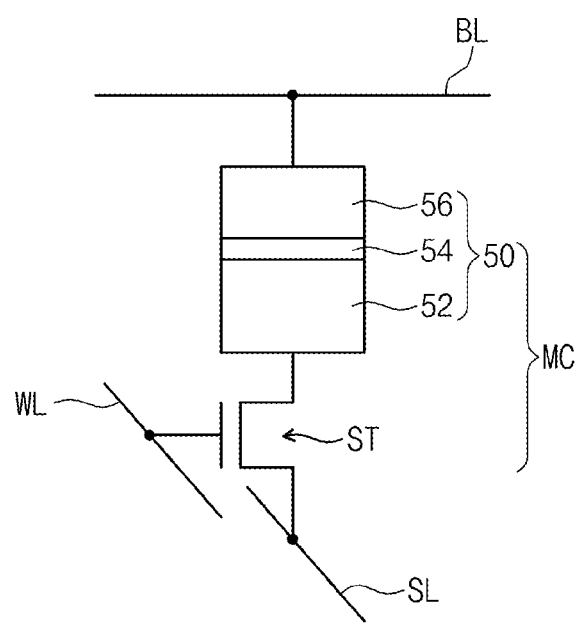
FIG. 1 is a schematic diagram illustrating a magnetic memory device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic diagram illustrating a magnetic memory device 100 according to example embodiments of the inventive concept.

Referring to FIG. 1, the magnetic memory device 100 may be, for example, a spin-torque-transfer magnetic random access memory (STT-MRAM) device. The magnetic memory device 100 may include a bit line BL, a source line SL, and a magnetic memory cell MC connecting the bit line BL to the source line SL in series. The magnetic memory cell MC may include a magnetic tunnel junction (MTJ) 50 and a selection device such as a selection transistor ST connected in series with respect to each other. The selection device may be configured to selectively control an electric current passing through the MTJ. For example, the selection device may also be a diode, a pnp bipolar transistor, an npn bipolar transistor, an NMOS field effect transistor (FET), or a PMOS FET.

A gate electrode of the selection transistor ST may be connected to a word line WL crossing the bit line BL. Further, one terminal (for example, first source/drain region) of the selection transistor ST may be connected to the source line SL, and other terminal (for example, second source region/drain region) may be connected to the MTJ 50. The MTJ 50 may include a fixed layer 52, a free layer 56, and a tunnel barrier 54 interposed therebetween. The fixed layer 52 of the MTJ 50 may be configured to have a fixed magnetization direction. Furthermore, in example embodiments, the fixed layer 52 may be configured in such a way that a direction of a magnetization easy axis thereof is perpendicular or in-plane.

The free layer 56 of the MTJ 50 may be configured to have a varying magnetization direction depending on an externally-applied condition. In example embodiments, the free layer 56 may also be configured in such a way that a direction of a magnetization easy axis thereof is perpendicular or in-plane. The resistance of the MTJ 50 may vary depending on the magnetization direction of the free layer 56. For example, when the free and fixed layers 56 and 52, respectively, have magnetization directions parallel to each other, the magnetic tunnel junction 50 may have a low resistance, corresponding to a logic '0' state. When the free and fixed layers 56 and 52, respectively, have magnetization directions antiparallel to each other, the MTJ 50 may have a high resistance, corresponding to a logic data '1'. An operation of changing the magnetization direction of the free layer 56 (or of writing the magnetic memory device 100) may be achieved by applying a voltage capable of turning-on the selection transistor ST to the word line WL and by applying a writing current between the bit line BL and the source line SL. In this case, electrons constituting the writing current may switch the magnetization direction of the free layer 56 through the spin-transfer-torque (STT) mechanism, and the switching direction may be controlled by a flowing direction of the writing current.

Figure 2A:
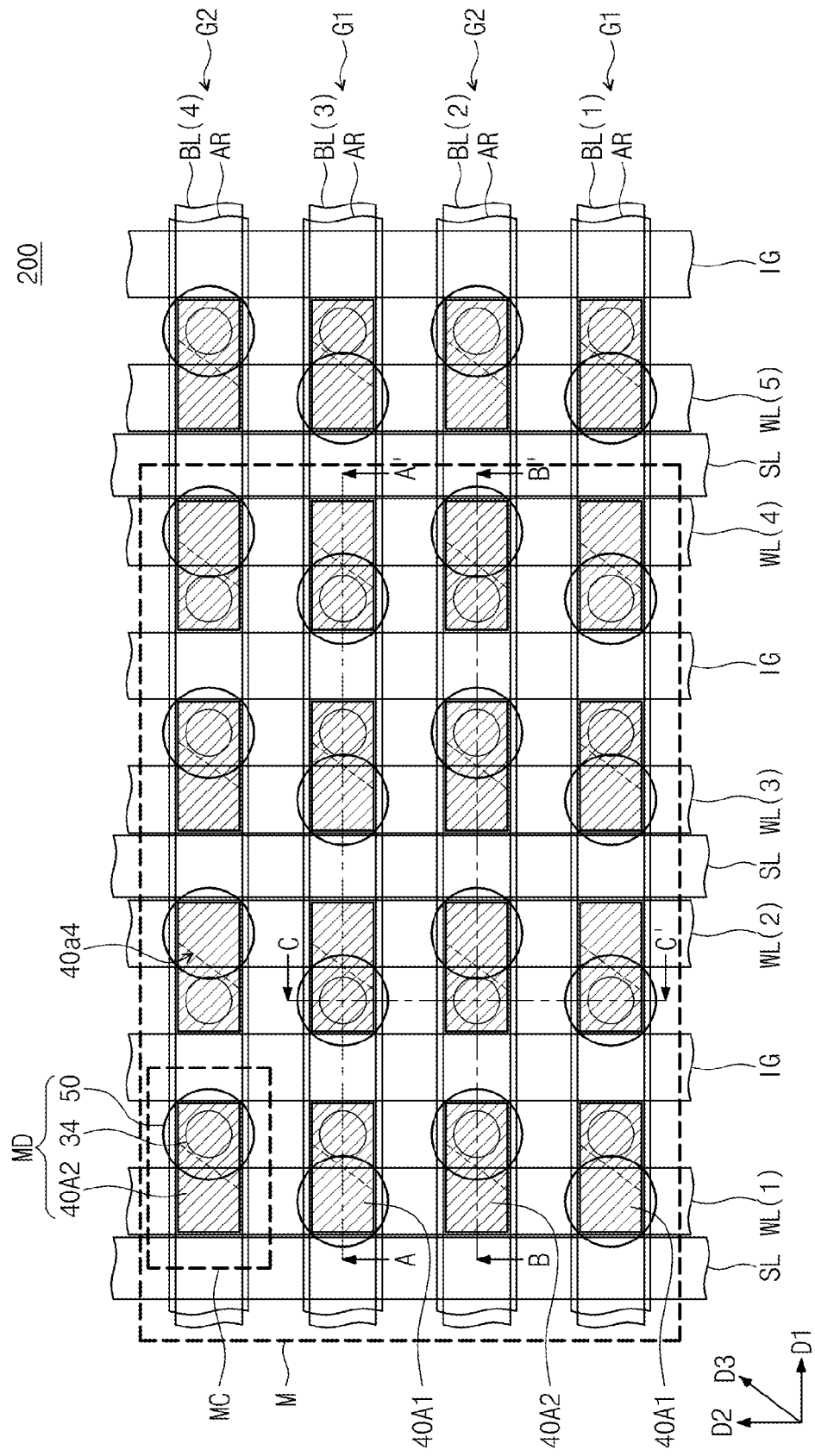
FIG. 2A is a plan view illustrating a portion of a cell array of a magnetic memory device according to example embodiments of the inventive concept.
Figure 2C:
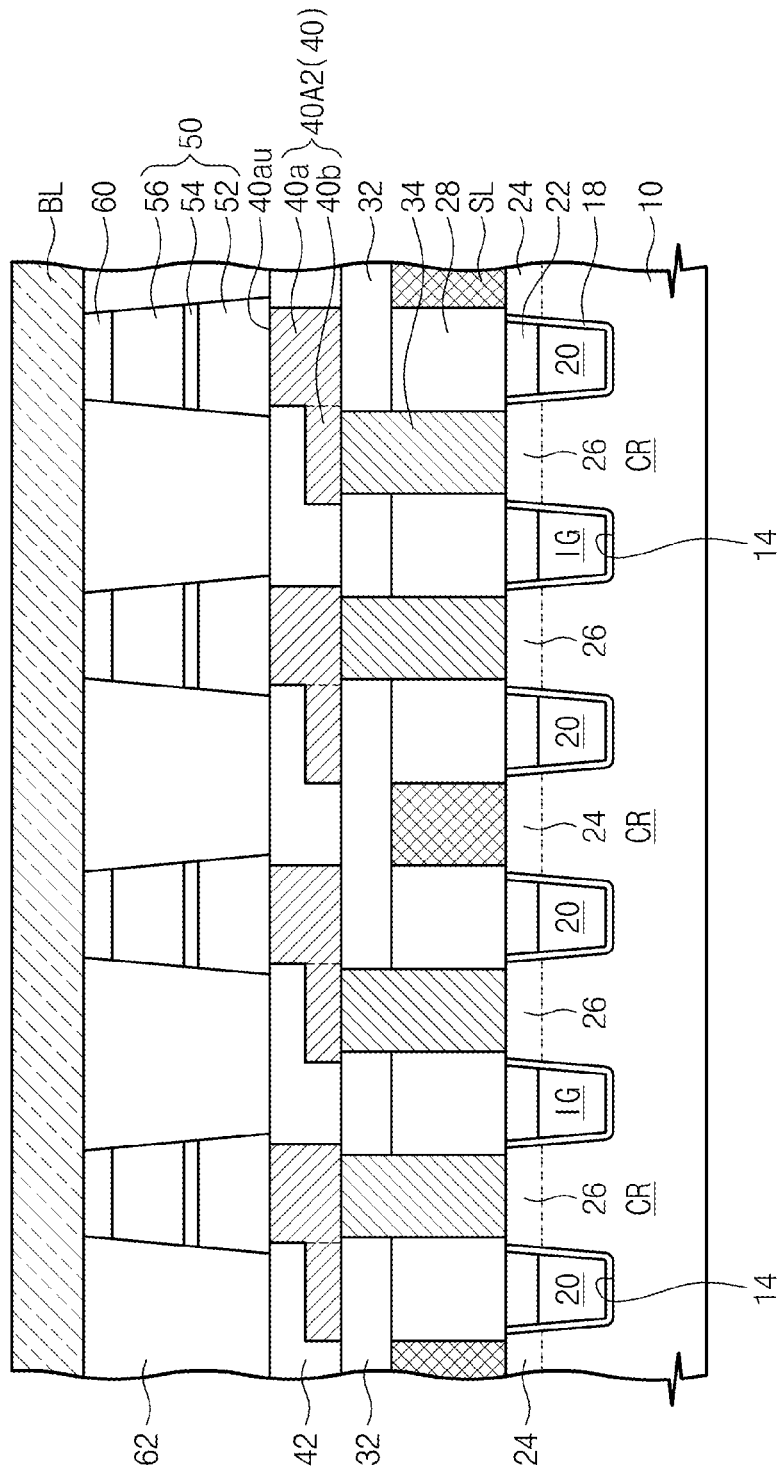
Figure 2D:
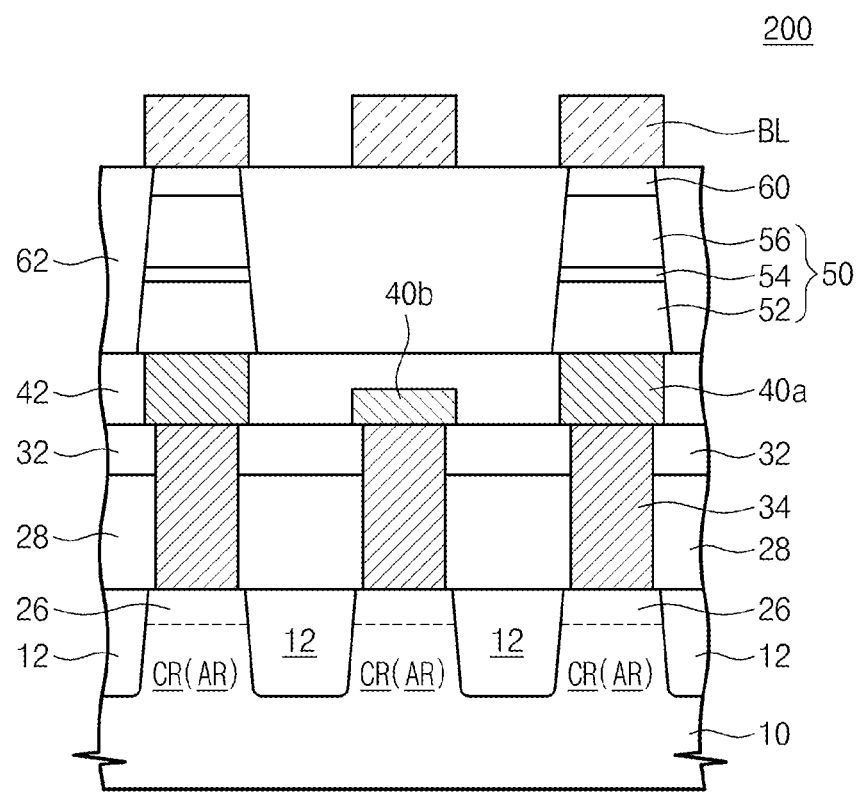

FIG. 2A is a plan view illustrating a portion of a cell array of a magnetic memory device 200 according to example embodiments of the inventive concept. FIGS. 2B, 2C, and 2D are cross-sectional views taken along dotted lines A-A', B-B', and C-C', respectively, of FIG. 2A.

Referring to FIGS. 2A through 2D, unit magnetic memory cells MC may be two-dimensionally arranged in rows and columns. Here, the rows may be substantially parallel to a first direction D1, and the columns may be substantially parallel to a second direction D2 or substantially perpendicular to the first direction D1. For example, field insulating layers or device isolation layers 12 may be formed on a semiconductor substrate 10 to define line-shaped active regions AR. The active regions AR may be arranged side-by-side in the second direction D2, and each of them may extend substantially parallel to the first direction D1. The active regions AR may be arranged equidistant from each other. The field insulating layers 12 may also be arranged side-by-side in the second direction D2, and each of them may extend substantially parallel to the first direction D1. The field insulating layers 12 and the active regions AR may be alternately arranged in the second direction D2. The semiconductor substrate 10 may be one of, for example, a silicon wafer, a germanium wafer, or a silicon-germanium wafer. The field insulating layers 12 may be a trench-type field isolation structure and include at least one of oxide, nitride, and/or oxynitride.

Isolation gate electrodes IG may be provided in gate trenches 14, respectively, which are formed to cross the active regions AR and the field insulating layers 12. Due to the presence of the isolation gate electrodes IG, each of the active regions AR may be divided into a plurality of active portions CR. For example, each active portion CR may be delimited by a pair of adjacent isolation gate electrodes IG and a pair of adjacent field insulating layers 12.

The isolation gate electrodes IG may be arranged side-by-side in the first direction D1, and each of them may extend substantially parallel to the second direction D2. The active portions CR may be arranged to form a plurality of rows substantially parallel to the first direction D1 and a plurality of columns substantially parallel to the second direction D2. In other words, the active portions CR may be two-dimensionally arranged in rows and columns on the semiconductor substrate 10. When the magnetic memory device 200 is operated, the active portions CR may be electrically isolated from each other by the isolation gate electrodes IG. For example, when the magnetic memory device 200 is operated, an isolation voltage may be applied to the isolation gate electrodes IG to prevent an undesired inversion region from being created in a portion of the semiconductor substrate 10 located below the isolation gate electrode IG. For example, by applying the isolation voltage, it is possible to substantially prevent the undesired channel region from being formed below the isolation gate electrodes IG. Accordingly, the active portions CR can be electrically isolated from each other. For example, if the active regions AR are doped with p-type impurities, a ground or negative voltage may be applied to the isolation gate electrode IG to isolate the active portions CR electrically from each other.

The word lines WL may be substantially parallel to the second direction D2 to cross the active portions CR. Further, the word lines WL may be substantially parallel to the isolation gate electrodes IG to cross the field insulating layers 12 located between the active portions CR. In example embodiments, a pair of word lines WL may be provided between the pair of adjacent isolation gate electrodes IG. Each word line WL may include or be a cell gate electrode 20, which may be provided in the gate trench 14. For example, the word lines WL may be connected to the cell gate electrodes 20, which are disposed in the gate trenches 14, respectively, and may serve as interconnection lines extending along the second direction D2. The cell gate electrode 20 may be provided in the form of a buried gate electrode provided in the substrate 10. The isolation gate electrode IG and the word line WL may be interconnection lines buried in the substrate 10 and the field insulating layers 12. A gate insulating layer 18 may be interposed between the cell gate electrode 20 and sidewalls of the gate trench 14. Further, the gate insulating layer 18 may be interposed between the isolation gate electrode IG and the sidewalls of the gate trench 14. The gate insulating layer 18 may include at least one of oxide, nitride, oxynitride, and/or high-k dielectric materials. The isolation gate electrode IG and the cell gate electrode 20 may include the same conductive material. For example, the isolation gate electrode IG and the cell gate electrode 20 may include at least one of metals (e.g., tungsten (W), titanium (Ti), and tantalum (Ta)), metal nitrides (e.g., tungsten nitride (WN), titanium nitride (TiN), and tantalum nitride (TaN)), or metal silicides (e.g., cobalt silicide (CoSi) and nickel silicide (NiSi)).

The isolation gate electrodes IG and the cell gate electrodes 20 may have top surfaces that are lower than that of the active portion CR. Capping insulating layers 22 may be provided on the isolation gate electrodes IG and the cell gate electrodes 20, respectively. The capping insulating layers 22 may have top surfaces that are substantially coplanar with those of the active portions CR adjacent thereto. The capping insulating layers 22 may include at least one of oxide, nitride, and/or oxynitride.

A first source/drain region 24 and second source/drain regions 26 may be provided in each of the active portions CR positioned between the pair of adjacent isolation gate electrodes IG. For example, in each active portion CR, a single first source/drain region 24 may be formed between a pair of adjacent cell gate electrodes 20. A pair of second source/drain regions 26 may be provided on both edges of each active portion CR. For example, the pair of adjacent cell gate electrodes 20 and the first source/drain region 24 interposed therebetween may be disposed between the pair of adjacent second source/drain regions 26. In other words, one of the second source/drain regions 26 may be provided in one side or edge of the active portion CR positioned between the isolation and cell gate electrodes IG and 20, and the other of the second source/drain regions 26 may be provided in the other side or edge of the active portion CR positioned between the cell and isolation gate electrodes 20 and IG. A pair of second source/drain regions 26 may be provided adjacent to opposite side surfaces of each isolation gate electrode IG. The first and second source/drain regions 24 and 26 may be doped with impurities (e.g., of n-type). In other words, each of the active portions CR may include a pair of second source/drain regions 26 and the first source/drain region 24, which is singly provided therebetween and spaced apart therefrom. As shown in FIG. 2A, when viewed in plan view, each of the pairs of cell gate electrodes 20 may be disposed between a corresponding pair of second source/drain regions 26, and the first source/drain region 24 may be disposed between a corresponding pair of cell gate electrodes 20.

In each of the active portions CR, the pair of cell gate electrodes 20, the first source/drain region 24, and the pair of second source/drain regions 26 may constitute a pair of transistors. The first source/drain region 24 may be shared by the pair of transistors. Each of the transistors formed on the active portions CR may serve as the selection transistor ST constituting the magnetic memory cell MC of FIG. 1.

The source lines SL may be provided on the substrate 10 and be connected to the first source/drain regions 24 of the active portions CR, respectively. For example, each of the source lines SL may connect the first source/drain regions 24, which are arranged along the second direction D2, to each other. The source lines SL may be arranged side-by-side in the first direction D1, and each of them may extend substantially parallel to the second direction D2. The source lines SL may be substantially parallel to the isolation and cell gate electrodes IG and 20. Each of the source lines SL may be shared by a pair of magnetic memory cells MC.

A first insulating layer 28 may be provided on the substrate 10. The source lines SL may be provided in the first insulating layer 28. Top surfaces of the source lines SL may be substantially coplanar with that of the first insulating layer 28.

A second insulating layer 32 may be provided on the first insulating layer 28 and the source lines SL. The first and second insulating layer 28 and 32 may include at least one of oxide, nitride, and/or oxynitride or other suitable insulating materials.

Contact plugs 34 may sequentially penetrate the second and first insulating layer 32 and 28. Here, the contact plugs 34 may be electrically connected to the second source/drain regions 26, respectively. The contact plugs 34 may be coupled to the second source/drain regions 26 of the active portions CR, respectively, which are arranged in rows and columns. In other words, the contact plugs 34 may be arranged in rows and columns, when viewed in plan view. For example, as shown in FIGS. 2B and 2C, each pair of contact plugs 34 may be arranged symmetrically with respect to a corresponding isolation gate electrode IG.

Between a pair of adjacent source lines SL, a plurality of pairs of contact plugs 34 may be arranged along the second direction D2. Each pair of contact plugs 34 may be disposed between a pair of word lines WL to have, for example, mirror symmetry with respect to the isolation gate electrode IG. Further, the contact plugs 34 may be arranged symmetrically with respect to the source line SL. A distance between a pair of adjacent contact plugs 34, which are positioned adjacent to a specific one of the source line SL, may be equal to or larger than a sum of widths of a pair of word lines WL and the source line SL. The source line SL and the contact plug 34 may include at least one of metals (e.g., tungsten (W), titanium (Ti), tantalum (Ta), and copper (Cu)), conductive metal nitrides (e.g., tungsten nitride (WN), titanium nitride (TiN), and tantalum nitride (TaN)), or metal silicides (e.g., cobalt silicide (CoSi) and nickel silicide (NiSi)).

Lower electrodes 40 may be provided on the second insulating layer 32 and be connected to the contact plug 34. The lower electrodes 40 may be electrically connected to the second source/drain regions 26 of the active portions CR, respectively, through the contact plugs 34. The lower electrodes 40 may be two-dimensionally arranged along the first and second directions or in rows and columns. A pair of lower electrodes 40 may be provided on each of the active portions CR. In example embodiments, each lower electrode 40 may include a portion located between the isolation gate electrode IG and the source line SL and thereby overlap the active portion CR when viewed in plan view. The lower electrodes 40 may be arranged to form a plurality of rows substantially parallel to the first direction D1 and a plurality of columns substantially parallel to the second direction D2. Each of the lower electrodes 40 may include a vertical portion 40a and a horizontal portion 40b. According to an arrangement of the vertical and horizontal portions 40a and 40b, the lower electrodes 40 may be classified into two types: a first type 40A1 (as shown in FIG. 2B) and a second type 40A2 (as shown in FIG. 2C). For example, the first type lower electrode 40A1 may have an 'L'-shaped section, while the second type lower electrode 40A2 may have a laterally inverted 'L'- or ']'-shaped section. Each of the lower electrodes 40A1, 40A2 may be shaped like a tetragon, when viewed in plan view. For example, each lower electrode 40 may have a substantially rectangular shape, when viewed in plan view.

Figure 3A:
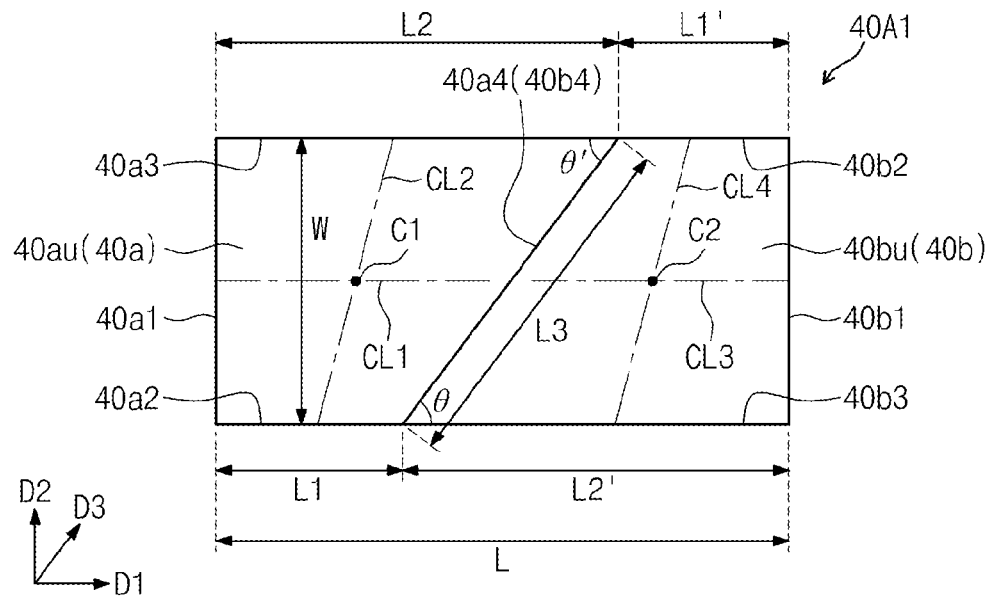
FIGS. 3A and 3B, respectively, are plan and perspective views illustrating a lower electrode of the magnetic memory device of FIG. 2B.
Figure 3B:
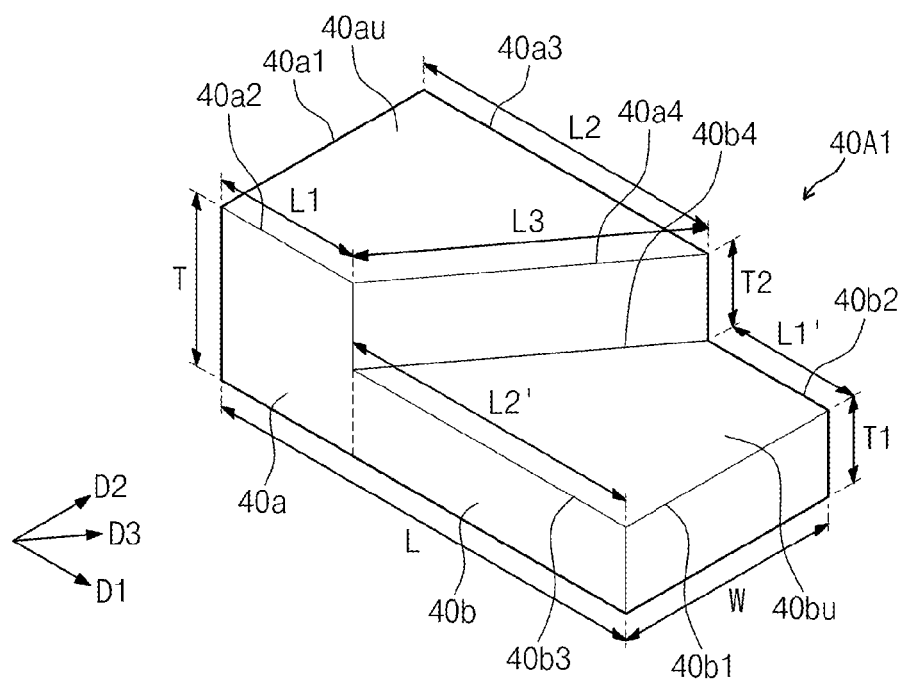

FIG. 3A is a plan view and FIG. 3B is a perspective view illustrating an example of the first-type lower electrode 40A1 of FIG. 2B. Referring to FIGS. 3A and 3B, in the first-type lower electrode 40A1, the vertical and horizontal portions 40a and 40b may be provided in such a way that the first-type lower electrode 40A1 can have the 'L'-shaped section. For example, a length L of the first-type lower electrode 40A1 may be about 1.2-2.5 times of a width W thereof. In the first-type lower electrode 40A1, the vertical portion 40a may have the thickness T and the horizontal portion 40b may have a first thickness T1. The vertical portion 40a may have a top surface 40au higher than a top surface 40bu of the horizontal portion 40b. For example, the vertical portion 40a may be thicker, by a second thickness T2 equal to T-T1, than the horizontal portion 40b. The horizontal portion 40b may be provided in such a way that the first thickness T1 thereof ranges from about ¼ to about ¾ times of the thickness (e.g., T) of the vertical portion 40a.

In some embodiments, the vertical portion 40a may be an upwardly extending region that is provided at a left side of the horizontal portion 40b. The top surface 40au of the vertical portion 40a may be shaped like a polygon, such as one having at least two parallel sides and at least one side arranged at an angle with respect to the two parallel sides or the first direction D1. For example, the top surface 40au of the vertical portion 40a may be shaped like a reversed trapezoid including two parallel sides and a side arranged at an angle with respect to the parallel sides. The trapezoid may thereby have an increasing width in the second direction D2 when viewed in plan view. For example, in the first-type lower electrode 40A1, the top surface 40au of the vertical portion 40a may include a first side 40a1, parallel to a width direction W of the first-type lower electrode 40A1, two sides (e.g., a second side 40a2 and a third side 40a3), substantially parallel to the length direction L of the first-type lower electrode 40A1, and a fourth side 40a4, substantially parallel to a diagonal direction or a third direction D3. Here, the third direction D3 may be at an angle to the first direction D1 or the length direction L of the first-type lower electrode 40A1. The first to fourth sides 40a1 to 40a4 may be connected to each other and the first side 40a1 may be substantially perpendicular to the second and third sides 40a2 and 40a3. The width direction W may be substantially parallel to the second direction D2, and the length direction L may be substantially parallel to the first direction D1.

In some embodiments, at least two of the sides may be curvedly connected in such a way that the top surface 40au of the vertical portion 40a can have at least one rounded corner.

The fourth side 40a4 may be slanted at an angle θ of, for example, between about 40 to about 80 degrees to the length direction L or the first direction D1 of the first-type lower electrode 40A1. In the top surface 40au of the vertical portion 40a, a length L1 of the second side 40a2 (e.g., a bottom side of the reversed trapezoid) may be shorter than a length L2 of the third side 40a3 (e.g., a top side of the reversed trapezoid). In the top surface 40au of the vertical portion 40a, a length L3 of the fourth side 40a4 may be longer than the length L1 of the second side 40a2 and be shorter or longer than the length L2 of the third side 40a3. Further, in the vertical portion 40a, the fourth side 40a4 may be positioned at a boundary between the vertical and horizontal portions 40a and 40b to cross the first-type lower electrode 40A1.

As a result, the fourth side 40a4 of the vertical portion 40a may include lower and upper sidewalls, which are respectively covered with and exposed by the horizontal portion 40b. Thicknesses of the upper and lower sidewalls of the fourth side 40a4 may be a second thickness T2 and a first thickness T1, respectively. The lower sidewall of the fourth side 40a4 may be vertically coplanar with the upper sidewall thereof. In example embodiments, the vertical and horizontal portions 40a and 40b may be integrally connected to each other to constitute a single pattern (i.e., the first-type lower electrode 40A1). For example, the lower sidewall of the fourth side 40a4 may have substantially the same chemical and physical properties as an internal region of the lower electrode 40A1, and thus, the lower sidewall of the fourth side 40a4 may not exhibit any interfacial property.

The top surface 40bu of the horizontal portion 40b may have the same or similar shape as the top surface 40au of the vertical portion 40a. For example, the top surface 40bu of the horizontal portion 40b and the top surface 40au of the vertical portion 40a may have rotational symmetry of 180 degrees. When viewed in plan view, the top surface 40bu of the horizontal portion 40b may be shaped like a trapezoid including two parallel sides and at least one side arranged at an angle with respect to the parallel sides (or the first direction D1) and may thereby have a decreasing width in the second direction D2. For example, in the first-type lower electrode 40A1, the top surface 40bu of the horizontal portion 40b may include a first side 40b1, substantially parallel to the width direction W of the first-type lower electrode 40A1, two sides (e.g., a second side 40b2 and a third side 40b3), substantially parallel to the length direction L of the first-type lower electrode 40A1, and a fourth side 40b4, substantially parallel the diagonal direction or the third direction D3, where the diagonal direction or the third direction D3 may be at an acute angle θ' of, for example, about 40 to about 80 degrees with respect to the length direction L of the first-type lower electrode 40A1 or the first direction D1. Further, a length L2' of the third side 40b3 (i.e., a bottom side of the trapezoid) may be longer than a length L1' of the second side 40b2 (i.e., a top side of the trapezoid). In the first-type lower electrode 40A1, an area of the top surface 40bu of the horizontal portion 40b may be substantially equal to or different from that of the top surface 40au of the vertical portion 40a.

Figure 3C:
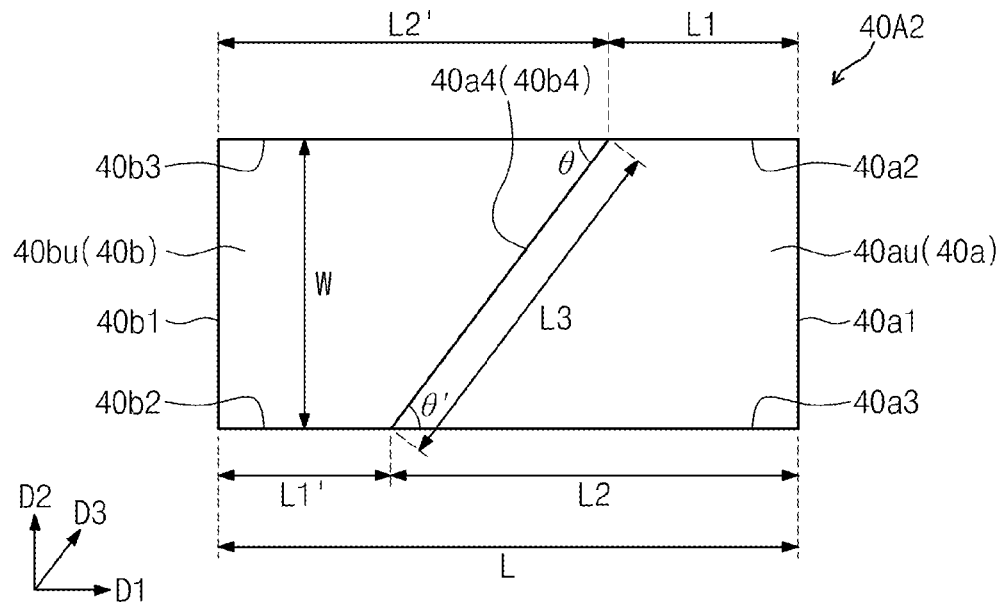
FIGS. 3C and 3D, respectively, are plan and perspective views illustrating a lower electrode of the magnetic memory device of FIG. 2C.
Figure 3D:
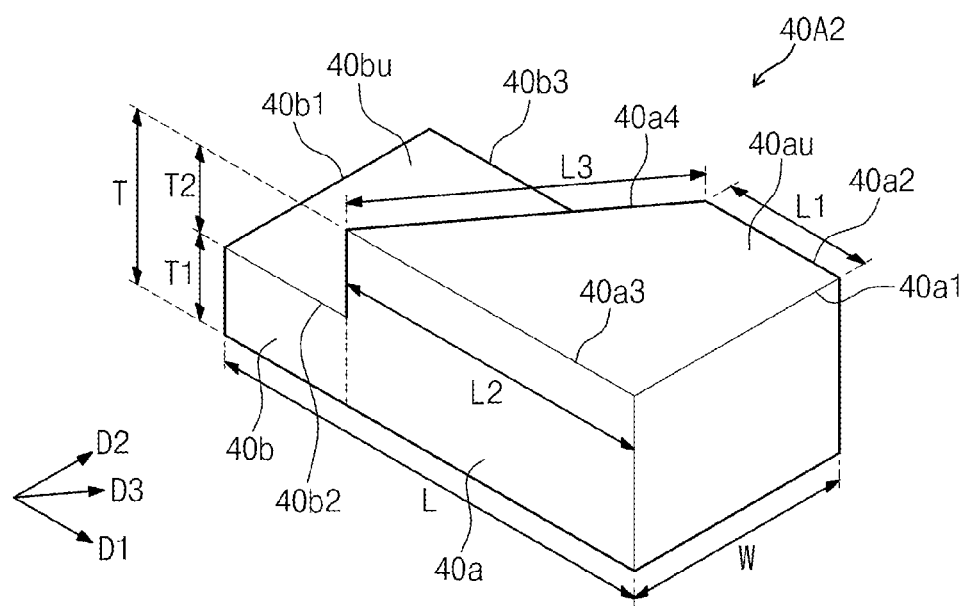

FIG. 3C is a plan view and FIG. 3D is a perspective view illustrating an example of a second-type lower electrode 40A2 of FIG. 2C. Referring to FIGS. 3C and 3C, in a second-type lower electrode 40A2 of FIG. 2C, the vertical and horizontal portions 40a and 40b may be provided in such a way that the second-type lower electrode 40A2 may have the laterally inverted 'L'- or ' ]'-shaped section. The second-type lower electrode 40A2 may be formed to have a length L greater than a width W. For example, the length L of the second-type lower electrode 40A2 may be about 1.2-2.5 times of the width W thereof. In the second-type lower electrode 40A2, the vertical portion 40a may be formed to have a thickness T and the horizontal portion 40b may be formed to have a first thickness T1. The vertical portion 40a may have a top surface 40au that is located higher than a top surface 40bu of the horizontal portion 40b. For example, the vertical portion 40a may be thicker, by a second thickness T2 equal to T-T1, than the horizontal portion 40b. The horizontal portion 40b may be provided in such a way that the first thickness T1 thereof ranges from about ¼ to about ¾ times of the thickness (e.g., T) of the vertical portion 40a.

In the second-type lower electrode 40A2, the vertical portion 40a may be provided at a right side of the horizontal portion 40b. In the second-type lower electrode 40A2, the top surface 40au of the vertical portion 40a may be shaped like a polygon including at least two parallel sides and at least one side at an angle with respect to them or the first direction D1. When viewed in plan view, the top surface 40au of the vertical portion 40a may be shaped like a trapezoid including two parallel sides and at least one side at an angle to them or the first direction D1 and thereby having a decreasing width in the second direction D2. The second-type lower electrode 40A2 may have a shape that is the same as would be obtained by rotating the first-type lower electrode 40A1 (described with reference to FIGS. 3A and 3B) by 180 degrees. In other words, the first and second-type lower electrodes 40A1, 40A2 may have rotational symmetry with respect to each other. For example, the top surface 40au of the vertical portion 40a of the second-type lower electrode 40A2 may have substantially the same or similar shape as the top surface 40bu of the horizontal portion 40b of the first-type lower electrode 40A1 of FIGS. 3A and 3B, and the top surface 40bu of the horizontal portion 40b of the second-type lower electrode 40A2 may have substantially the same or similar shape as the top surface 40au of the vertical portion 40a of the first-type lower electrode 40A1 of FIGS. 3A and 3B. For example, in the second-type lower electrode 40A2, the top surface 40au of the vertical portion 40a may include a first side 40a1, substantially parallel to a width direction W of the second-type lower electrode 40A2, two parallel sides (e.g., second and third sides 40a2 and 40a3), substantially parallel to the length direction L of the second-type lower electrode 40A2, and a fourth side 40a4, which is substantially parallel to the diagonal direction or the third direction D3. Here, the third direction D3 may be at an angle with respect to the first direction D1 or the length direction L of the lower electrode 40A2. The fourth side 40a4 may be slanted at an angle θ of, for example, about 40 to about 80 degrees with respect to the length direction L of the second-type lower electrode 40A2 or the first direction D1. The first to fourth sides 40a1 to 40a4 may be connected to each other and the first side 40a1 may be substantially perpendicular to the second and third sides 40a2 and 40a3. The width direction W may be substantially parallel to the second direction D2, and the length direction L may be substantially parallel to the first direction D1. In some embodiments, at least two of the sides may be curvedly connected in such a way that the top surface 40au of the vertical portion 40a can have at least one rounded corner.

In the top surface 40*au* of the vertical portion 40*a*, a length L1 of the second side 40*a*2 (e.g., a top side of the trapezoid) may be shorter than a length L2 of the third side 40*a*3 (e.g., a bottom side of the trapezoid). In the top surface 40*au* of the vertical portion 40*a*, a length L3 of the fourth side 40*a*4 may be longer than the length L1 of the second side 40*a*2 and may be shorter or longer than the length L2 of the third side 40*a*3. Further, in the vertical portion 40*a*, the fourth side 40*a*4 may be positioned at a boundary between the vertical and horizontal portions 40*a* and 40*b* to cross the second-type lower electrode 40A2. As a result, the fourth side 40*a*4 of the vertical portion 40*a* may include lower and upper sidewalls, which are covered with and exposed by the horizontal portion 40*b*. The lower sidewall of the fourth side 40*a*4 may be vertically coplanar with the upper sidewall thereof. Thicknesses of the upper and lower sidewalls of the fourth side 40*a*4 may be a second thickness T2 and a first thickness T1, respectively. In example embodiments, the vertical and horizontal portions 40*a* and 40*b* may constitute a single pattern (i.e., the second-type lower electrode 40A2) continuously connected to each other. For example, the lower sidewall of the fourth side 40*a*4 may have substantially the same chemical and physical properties as an internal region of the lower electrode 40A2, and thus, the lower sidewall of the fourth side 40*a*4 may not exhibit any interfacial property.

In the second-type lower electrode 40A2, the top surface 40*bu* of the horizontal portion 40*b* may have substantially the same or similar shape as the top surface 40*au* of the vertical portion 40*a*. For example, the top surface 40*bu* of the horizontal portion 40*b* and the top surface 40*au* of the vertical portion 40*a* may have rotational symmetry of 180 degrees. When viewed in plan view, the top surface 40*bu* of the horizontal portion 40*b* may be shaped like a reversed trapezoid including, for example, two parallel sides and at least one side at an angle to them or the bit line BL and having an increasing width in the second direction D2. For example, in the second-type lower electrode 40A2, the top surface 40*bu* of the horizontal portion 40*b* may include a first side 40*b*1, which is substantially parallel to the width direction W of the second-type lower electrode 40A2, two sides (e.g., second and third sides 40*b*2 and 40*b*3), which are substantially parallel to the length direction L of the second-type lower electrode 40A2, and a fourth side 40*b*4, which is substantially parallel the diagonal direction or the third direction D3, where the diagonal direction or the third direction D3 may be at an acute angle θ' of, for example, about 40 to about 80 degrees with respect to the length direction L of the second-type lower electrode 40A2 or the first direction D1. Further, a length L1' of the second side 40*b*2 (i.e., a bottom side of the reversed trapezoid) may be shorter than a length L2' of the third side 40*b*3 (i.e., a top side of the reversed trapezoid). In the second-type lower electrode 40A2, an area of the top surface 40*bu* of the horizontal portion 40*b* may be equal to or different from that of the top surface 40*au* of the vertical portion 40*a*.

In example embodiments, the first-type lower electrode 40A1 may have substantially the same thickness T and substantially the same width W as the second-type lower electrode 40A2. Further, in the first- and second-type lower electrodes 40A1, 40A2, the horizontal portions 40*b* may have substantially the same thickness, and the top surface 40*au* of the vertical portions 40*a* may have substantially the same area.

Figure 4A:
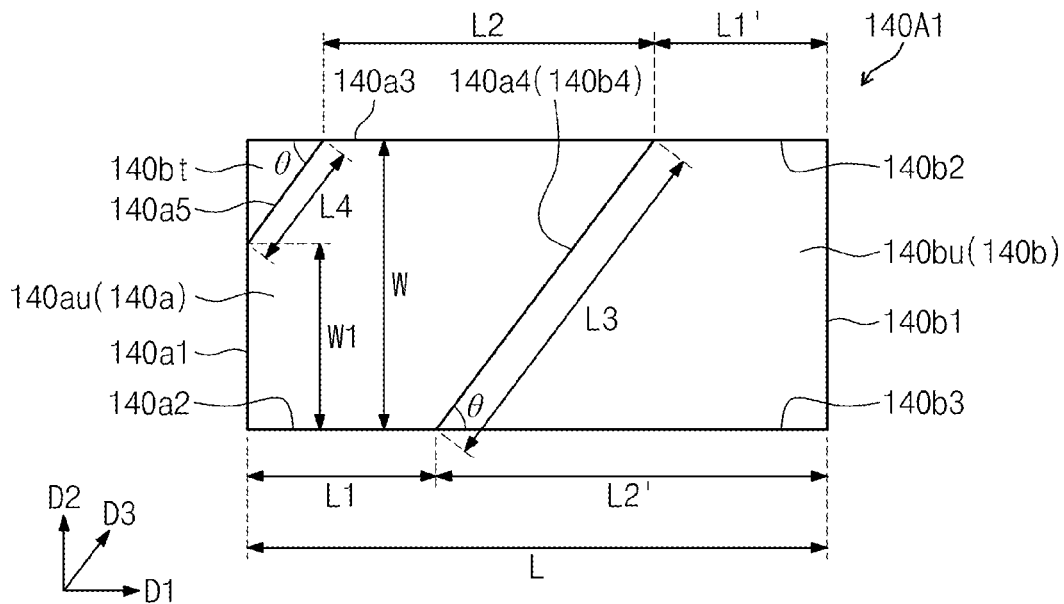
FIG. 4A is a plan view illustrating a modified example of the lower electrode of the magnetic memory device of FIG. 2B.

FIG. 4A is a plan view illustrating a modified example of the first-type lower electrode 40A1 of FIG. 2B. Referring to FIG. 4A, a first-type lower electrode 140A1 may have an 'L'-shaped section, and have a length L and a width W. The first-type lower electrode 140A1 may include a vertical portion 140*a* having a pentagonal top surface 140*au*. For example, when viewed in plan view, the pentagonal top surface 140*au* of the vertical portion 140*a* may include two sides 140*a*2 and 140*a*3, which are substantially parallel to the length direction L of the first-type lower electrode 140, two sides 140*a*4 and 140*a*5, which are substantially parallel to a diagonal direction, and a side 140*a*1, which is substantially parallel to the width direction W of the first-type lower electrode 140. The diagonal or third direction D3 may be slanted at an acute angle θ of, for example, about 40 to about 80 degrees with respect to the length direction L of the first-type lower electrode 140A1 or the first direction D1, and in some embodiments, the sides 140*a*4 and 140*a*5 substantially parallel to the diagonal or third direction D3 may be substantially parallel to each other. The first to fifth sides 140*a*1 to 140*a*5 may be connected to each other, and the first side 140*a*1 may be substantially perpendicular to the second side 140*a*2. The width direction W may be substantially parallel to the second direction D2, and the length direction L may be substantially parallel to the first direction D1. In some embodiments, at least two of the sides 140*a*1 to 140*a*5 may be curvedly connected in such a way that the top surface 140*au* of the vertical portion 140*a* can have at least one rounded corner.

The first side 140*a*1 of the top surface 140*au* of the vertical portion 140*a* may have a width W1 shorter than the width W of the first-type lower electrode 140A1. A length L2 of the third side 140*a*3 of the top surface 140*au* of the vertical portion 140*a* may be shorter than the length L2 of the third side 40*a*3 of the top surface 40*au* of the vertical portion 40*a* of the first-type lower electrode 40A1 described with reference to FIGS. 3A and 3B. A horizontal portion 140*b* may include a region 140*bt* adjacent to the fifth side 140*a*5 of the top surface 140*au* of the vertical portion 140*a*. The region 140*bt* may have a triangle shape.

Figure 4B:
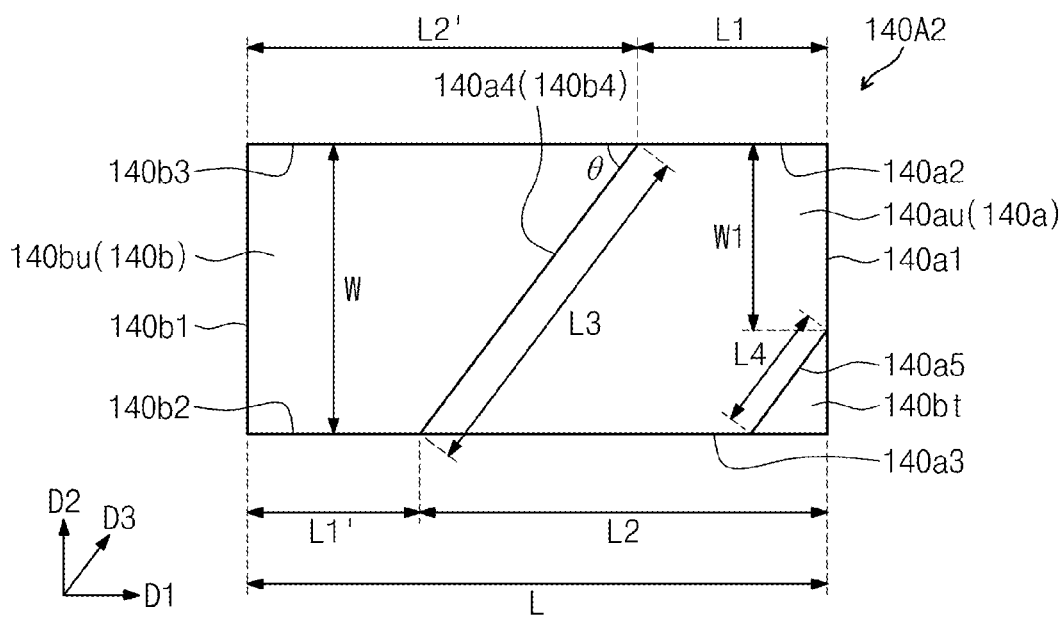
FIG. 4B is a plan view illustrating a modified example of the lower electrode of the magnetic memory device of FIG. 2C.

FIG. 4B is a plan view illustrating a modified example of the second-type lower electrode 40A2 of FIG. 2C. Referring to FIG. 4B, a second-type lower electrode 140A2 may have a laterally inverted 'L'- or '⌐'-shaped section and have a length L and a width W. The second-type lower electrode 140A2 may include a vertical portion 140*a* having a pentagonal top surface 140*au*. For example, when viewed in plan view, the pentagonal top surface 140*au* of the vertical portion 140*a* may include two sides 140*a*2 and 140*a*3, which are substantially parallel to the length direction L of the second-type lower electrode 140A2, two sides 140*a*4 and 140*a*5, which are substantially parallel to a diagonal direction, and a side 140*a*1, which is substantially parallel to the width direction W of the second-type lower electrode 140A2. The diagonal or third direction D3 may be slanted at an acute angle θ of, for example, about 40 to about 80 degrees with respect to the length direction L of the second-type lower electrode 140A2 or the first direction D1, and in some embodiments, the sides 140*a*4 and 140*a*5 substantially parallel to the diagonal or third direction D3 may be substantially parallel to each other. The first to fifth sides 140*a*1 to 140*a*5 may be connected to each other and the first side 140*a*1 may be substantially perpendicular to the second side 140*a*2. The width direction W may be parallel to the second direction D2, and the length direction L may be parallel to the first direction D1. In some embodiments, at least two of the sides 140*a*1 to 140*a*5 may be curvedly connected in such a way that the top surface 140*au* of the vertical portion 140*a* can have at least one rounded corner.

The first side 140*a*1 of the top surface 140*au* of the vertical portion 140*a* may have a width W1 shorter than the width W of the second-type lower electrode 140A2. A length L2 of the third side 140*a*3 of the top surface 140*au* of the vertical portion 140a may be shorter than the length L2 of the third side 40a3 of the top surface 40au of the vertical portion 40a of the second-type lower electrode 40A2 described with reference to FIGS. 3C and 3D. The horizontal portion 140b of the second-type lower electrode 140A2 may include a region 140bt adjacent to the fifth side 140a5 of the top surface 140au of the vertical portion 140a.

Referring back to FIGS. 2A through 2D, the first-type lower electrodes 40A1 may constitute a plurality of first lower electrode groups G1 arranged along the second direction D2, and the second-type lower electrodes 40A2 may constitute a plurality of second lower electrode groups G2 arranged along the second direction D2. Each of the first lower electrode groups G1 may include the first-type lower electrodes 40A1 arranged in a row along the first direction D1, and each of the second lower electrode groups G2 may include the second-type lower electrodes 40A2 arranged in a row along the first direction D1. According to the above-described embodiments, each of the first lower electrode groups G1 may have the 'L'-shaped section and the polygonal top surface 40au including two parallel sides and at least one side at an angle to them or the first direction D1, while each of the second lower electrode groups G2 may have a laterally inverted 'L'- or ' ]'-shaped section and the polygonal top surface 40au including two parallel sides and one side at an angle to them or the first direction D1. In example embodiments, the first and second lower electrode groups G1 and G2 may be alternately arranged in the second direction D2. For example, one second lower electrode group G2 may be provided between a pair of adjacent first lower electrode groups G1, and one first lower electrode group G1 may be provided between a pair of adjacent second lower electrode groups G2. The first-type and the second-type lower electrodes 40A1, 40A2 may include a conductive material. For example, the lower electrodes 40A1, 40A2 may include at least one of a metal (e.g., tungsten (W), titanium (Ti), and/or tantalum Ta)), a metal nitride (e.g., tungsten nitride (WN), titanium nitride (TiN), and/or tantalum nitride (TaN)), a metal carbide (e.g., titanium carbide (TiC)), and/or a metal silicide (e.g., cobalt silicide (CoSi), nickel silicide (NiSi), and/or titanium silicide (TiSi)).

A third insulating layer 42 may be provided on the second insulating layer 32 to fill gaps between the lower electrodes 40A1 and/or 40A2. The third insulating layer 42 may be provided to cover a side surface of the lower electrode 40A1 and/or 40A2 (for example, side and top surfaces of the horizontal portion 40b and a side surface of the vertical portion 40a). The top surface 40au of the vertical portion 40a may be exposed through the third insulating layer 42. The third insulating layer 42 may have a top surface substantially coplanar with the top surface 40au of the vertical portion 40a.

The MTJ 50, as a data storage element, may be connected to the lower electrode 40A1 or 40A2. For example, the MTJ 50 may be provided on the third insulating layer 42 and be electrically connected to the vertical portion 40a of the lower electrode 40A1 or 40A2. The MTJ 50 may be electrically connected the second source/drain region 26. The MTJs 50 may be two-dimensionally arranged along the first and second directions D1 and D2 or in rows and columns. A pair of MTJs 50 may be provided on each of the active portions CR. The MTJ 50 may include, for example, the fixed layer 52, the free layer 56, and the tunnel barrier 54 interposed therebetween. The fixed layer 52 and the free layer 56 of the MTJ 50 may include at least one ferromagnetic material exhibiting a perpendicular or in-plane magnetization property. The tunnel barrier 54 may include at least one of magnesium oxide, titanium oxide, aluminum oxide, magnesium zinc oxide, or magnesium boron oxide. Operations of the MTJ 50 may be the same as those described with reference to FIG. 1.

On the free layers 56 of the MTJs 50, upper electrodes 60 may be e in contact with the MTJs 50, respectively. In some embodiments, the upper electrode 60 may include substantially the same material as that for the lower electrode 40A1, 40A2, but example embodiments of the inventive concepts may not be limited thereto.

The MTJ 50 may have an outer sidewall extending slantedly from a top of the free layer 56 to a bottom of the fixed layer 52. For example, the MTJ 50 may be a cylindrical structure, whose outer sidewall is slanted at an angle with respect to the top surface of the substrate 10. A bottom width of the fixed layer 52 may be greater than a top width of the free layer 56. In example embodiments, the upper electrode 60 and the MTJ 50 may be patterned simultaneously by the same process. As the result of the above described shape of the lower electrode 40A1, 40A2, it is possible to substantially reduce an exposed area of the vertical portion 40a, when the patterning process is performed to form the MTJ 50, making it possible to suppress the lower electrode 40A1, 40A2 from being unintentionally etched, for example, during the patterning process. Accordingly, it is possible to suppress an etch residue from being produced from the lower electrode 40A1, 40A2 and thereby to prevent a conductive bridge from being formed between adjacent MTJs 50 or the adjacent lower electrodes 40A1, 40A2. Furthermore, since the etch residue originated from the lower electrode 40A1, 40A2 can be substantially prevented from being deposited on the sidewall of the MTJ 50, a short circuit can be prevented between the free layer 56 and the fixed layer 52. Accordingly, reliability of the magnetic memory device 200 can be improved.

A fourth insulating layer 62 may be provided on the third insulating layer 42. The fourth insulating layer 62 may cover side surfaces of the MTJs 50 and the upper electrodes 60. In example embodiments, the fourth insulating layer 62 may have a top surface, which may be substantially coplanar with the top surfaces of the upper electrodes 60. Each or both of the third and fourth insulating layers 42 and 62 may include oxide, nitride, and/or oxynitride.

The bit lines BL may be provided on the fourth insulating layer 62 to connect the upper electrodes 60 to each other. The bit lines BL may be arranged side-by-side in the second direction D2. For example, the bit lines BL may be arranged equidistant from each other. Each of the bit lines BL may extend substantially parallel to the first direction D1.

Each of the bit lines BL may be electrically connected to a plurality of the MTJs 50 constituting each row. When viewed in plan view, the bit lines BL may be overlapped with the active regions AR. The bit lines BL may include at least one conductive material. For example, the bit lines BL may include one of tungsten (W), aluminum (Al), and/or copper (Cu). Hereinafter, relative positional relationships between the contact plug 34, the lower electrode 40A1, 40A2, and the MTJ 50 of the magnetic memory cell MC will be described.

Figure 5:
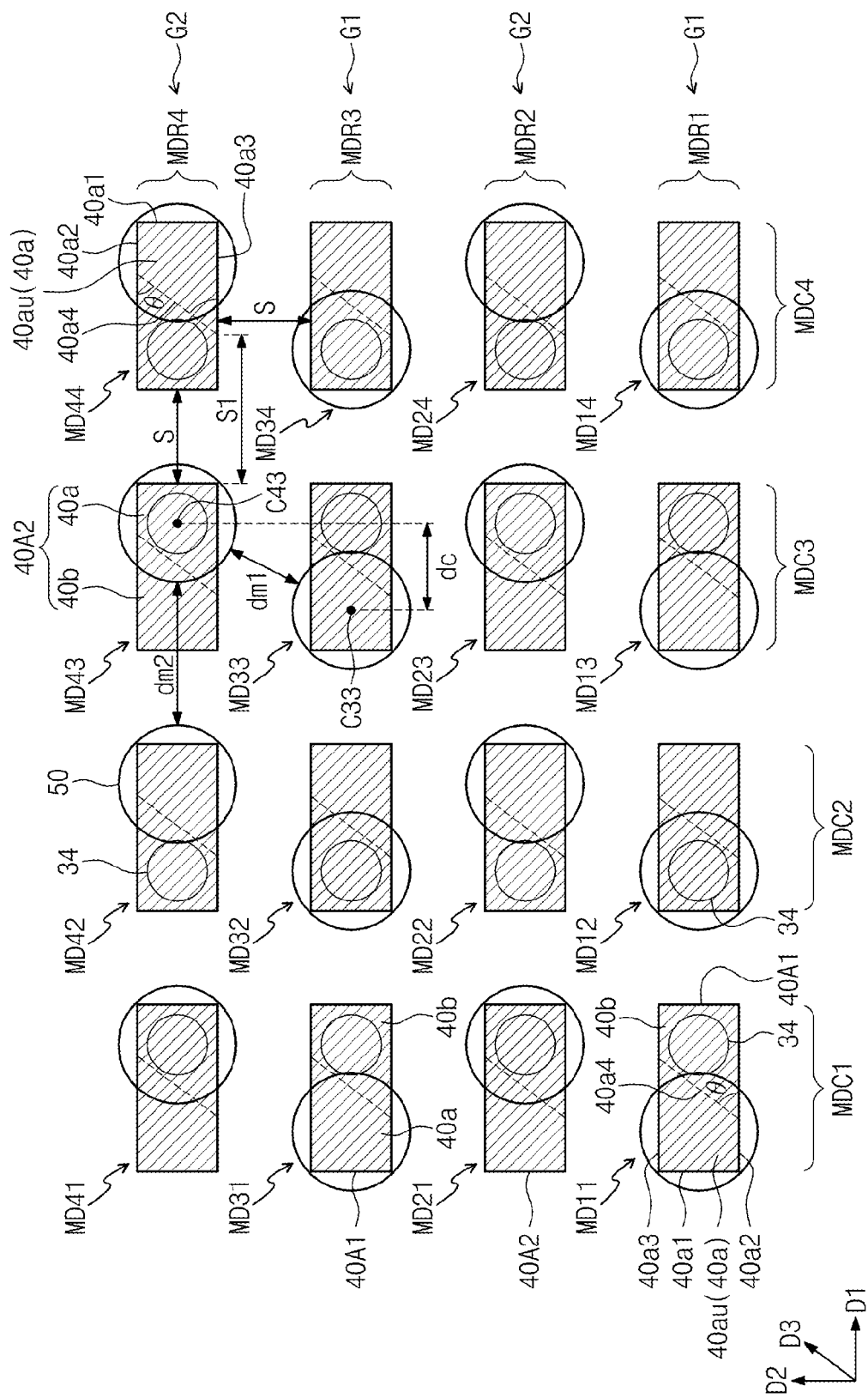
FIG. 5 is a plan view schematically illustrating MTJ devices provided in a region M of FIG. 2A.

FIG. 5 is a plan view schematically illustrating MTJ devices MD, which are arranged to have, for example, a 4×4 matrix structure, in a region M of FIG. 2A. Here, each of magnetic tunnel junction (MTJ) devices MD may be a structure including a contact plug 34, a lower electrode 40A1, 40A2, and a MTJ 50.

Referring to FIGS. 2A and 5, MTJ devices MD may be two-dimensionally arranged along the first and second directions D1 and D2 or in rows and columns. For example, some of the MTJ devices MD may be arranged to form four rows MDR1, MDR2, MDR3, and MDR4 and four columns MDC1, MDC2, MDC3, and MDC4. The rows MDR1 to MDR4 may be substantially parallel to the direction of the bit line BL, and the columns MDC1 to MDC4 may be substantially parallel to the direction of the word line WL. For example, each of the rows of the MTJ devices MD may be associated with or disposed below a corresponding one of the bit lines BL, and each of the columns of the MTJ devices MD may be associated with or disposed on a corresponding one of the word lines WL. The MTJ devices MD may be two-dimensionally disposed between the bit lines BL and the word lines WL. MTJ devices MD11, MD12, MD13, and MD14 may be arranged in the first row MDR1, MTJ devices MD21, MD22, MD23, and MD24 may be arranged in the second row MDR2, MTJ devices MD31, MD32, MD33, and MD34 may be arranged in the third row MDR3, and MTJ devices MD41, MD42, MD43, and MD44 may be arranged in the fourth row MDR4. Further, the MTJ devices MD11, MD21, MD31, and MD41 may be arranged in the first column MDC1, the MTJ devices MD12, MD22, MD32, and MD42 may be arranged in the second column MDC2, the MTJ devices MD13, MD23, MD33, and MD43 may be arranged in the third column MDC3, and the MTJ devices MD14, MD24, MD34, and MD44 may be arranged in the fourth column MDC4. The lower electrodes 40, which are included in adjacent ones of the columns and adjacent ones of the rows, may be spaced apart from each other. In some embodiments, the space S between the adjacent lower electrodes 40 may be substantially constant, regardless of the position under consideration. The space S between the adjacent lower electrodes 40A1, 40A2 may be the same as, for example, the width W of the lower electrode 40A1, 40A2. In some embodiments, the space S between the lower electrodes 40A1, 40A2 may correspond to a critical dimension of the device or a minimum feature size (i.e., 1F). The vertical portions 40$a$ of the lower electrodes 40A1, 40A2 arranged adjacent to each other in the same column may be spaced apart from each other in the row direction. In some embodiments, a pair of adjacent lower electrodes 40 in the same row may be arranged in such a way that the space S1 between the vertical portions 40$a$ thereof may be substantially constant, regardless of the position under consideration. The space Si may be greater than the space S between the lower electrodes 40A1, 40A2. The lower electrodes 40A1, 40A2 in the same column may be arranged in such a way that the top surfaces 40$au$ of a pair of adjacent vertical portions 40$a$ thereof can have rotational symmetry. Here, a reference point of the rotational symmetry may be selected as a point located between the pair of adjacent lower electrodes 40 under consideration. For example, the reference point for the rotational symmetry may be positioned on a line that crosses centers of the lower electrodes 40. Accordingly, the lower electrodes 40 in the same column can be arranged without any overlapped portion. For example, the vertical portions 40$a$ of the lower electrodes 40A1, 40A2 may be arranged in a zigzag manner along the second direction D2. Further, in the same column, the vertical portions 40$a$ of the lower electrodes 40A1, 40A2 arranged in every other row may have top surfaces 40$au$ positioned along substantially the same line. In other words, the configuration of the vertical portions 40$a$ of the first-type and second-type lower electrodes 40A1, 40A2 form an alternating and repeating pattern, respectively, with vertical portions 40$a$ of first-type lower electrodes 40A1 (arranged in alternating rows) being located along one line, and vertical portions 40$a$ of second-type lower electrodes 40A2 (arranged in alternating rows other than the first-type lower electrodes 40A1) being located along a different line.

For example, in odd-numbered rows (for example, the first and third rows MDR1 and MDR3), each of the MTJ devices MD may include the first-type lower electrode 40A1 having the reversed trapezoidal top surface 40$au$. The reversed trapezoidal top surface 40$au$ may include the first side 40$a$1, which is substantially parallel to the second direction D2, the second and third sides 40$a$2 and 40$a$3, which are substantially parallel to the first direction D1, and the fourth side 40$a$4, which is substantially parallel to the diagonal or third direction D3. The third side 40$a$3 may be longer than the second side 40$a$2. Accordingly, when viewed in plan view, the reversed trapezoidal top surface 40$au$ may have an increasing width in the second direction D2. The lower electrodes 40A1 having the reversed trapezoidal top surface 40$au$ may be arranged in the first direction D1. The third direction D3 may be arranged at an angle θ of between about 40 to about 80 degrees with respect to the first direction D1. In other words, the fourth side 40$a$4 may be slanted at the angle θ (for example, of about 40 to about 80 degrees) to the first direction D1 or a longitudinal direction of the bit line BL. In some embodiments, at least two of the sides may be curvedly connected in such a way that the top surface 40$au$ of the vertical portion 40$a$ can have at least one rounded corner.

In even-numbered rows (for example, the second and fourth rows MDR2 and MDR4), each of the MTJ devices MD may include the second-type lower electrode 40A2 having the trapezoidal top surface 40$au$. The trapezoidal top surface 40$au$ may include the first side 40$a$1, which is substantially parallel to the second direction D2, the second and third sides 40$a$2 and 40$a$3, which are substantially parallel to the first direction D1, and the fourth side 40$a$4, which is substantially parallel to the diagonal or third direction D3. The third side 40$a$3 may be longer than the second side 40$a$2. Accordingly, when viewed in plan view, the trapezoidal top surface 40$au$ may have a decreasing width in the second direction D2. The lower electrodes 40A2 having the trapezoidal top surfaces 40$au$ may be arranged in the first direction D1. The third direction D3 may be at an angle θ' of about 40 to about 80 degrees with respect to the first direction D1. In other words, the fourth side 40$a$4 may be slanted at the angle θ' (for example, of about 40 to about 80 degrees) to the first direction D1 or a longitudinal direction of the bit line BL. In some embodiments, at least two of the sides may be curvedly connected in such a way that the top surface 40$au$ of the vertical portion 40$a$ can have at least one rounded corner.

The first- and second-type lower electrodes 40A1 and 40A2, respectively, may be alternately disposed in the second direction D2. In example embodiments, when viewed in plan view, each of the vertical portions 40$a$ of the first-type lower electrodes 40A1 disposed below odd-numbered ones of the bit lines BL (e.g., BL (1), BL (3)) may have a center portion overlapped with a corresponding one of the odd-numbered ones of the word lines WL (e.g., WL (1), WL (3)), and each of the vertical portions 40$a$ of the second-type lower electrodes 40A2 disposed below even-numbered ones of the bit lines BL (e.g., BL (2), BL (4)) may have a center portion spaced apart from the odd-numbered ones of the word lines WL (e.g., WL(1), WL(3)). Similarly, each of the vertical portions 40$a$ of the second-type lower electrodes 40A2 disposed below even-numbered ones of the bit lines BL may have a center portion overlapped with a corresponding one of the even-numbered ones of the word lines WL, and each of the vertical portions 40$a$ of the first-type lower electrodes 40 disposed below odd-numbered ones of the bit lines BL may have a center portion spaced apart from the even-numbered ones of the word lines WL.

When viewed in plan view, as shown in FIG. 3A, the centers C1 or C2 of each of the vertical and horizontal portions 40$a$ and 40$b$, respectively, may be located at an intersection of corresponding center lines CL1 and CL2 or CL3 and CL4, respectively, which connect centers of opposite sides of the vertical portion 40a or horizontal portion 40b. Referring back to FIGS. 2A and 5, in some embodiments, when viewed in plan view, the first-type lower electrodes 40A1 disposed below the odd-numbered ones of the bit lines BL may be disposed in such a way that the centers of the vertical portions 40a of the first-type lower electrodes 40A1 are overlapped with the odd-numbered ones of the word lines WL, and that the centers of the horizontal portions 40b of the first-type lower electrodes 40A1 are overlapped with the even-numbered ones of word lines WL. Further, the second-type lower electrodes 40A2 disposed below the even-numbered ones of the bit lines BL may be disposed in such a way that the centers of the horizontal portions 40b of the second-type lower electrodes 40A2 are overlapped with the odd-numbered ones of the word lines WL, and that the centers of the vertical portions 40a of the second-type lower electrodes 40A2 are overlapped with the even-numbered ones of word lines WL.

In some other embodiments, the lower electrodes 40A1, 40A2 may be grouped into a plurality of groups G1, G2, each group having fourth sides 40a4 positioned along a same diagonal line. For example, when viewed in plan view, the lower electrodes 40A1, 40A2 of each group G1, G2 may be provided on different ones of the word lines WL and below different even- or odd-numbered ones of the bit lines BL.

The contact plugs 34 may be two-dimensionally arranged in the first and second directions D1 and D2 or in rows and columns. The contact plug 34 may be coupled to the vertical portion 40a or the horizontal portion 40b of the lower electrode 40A1, 40A2. The vertical and horizontal portions 40a and 40b coupled to the contact plugs 34 may be alternately arranged in the first and second directions D1 and D2 to form a plurality of rows and a plurality of columns.

For example, a pair of contact plugs 34 on the first row MDR1 may be disposed spaced apart from each other at both sides of the isolation gate electrode IG and be connected to the horizontal portion 40b of the first-type lower electrode 40A1 (e.g., of the MTJ device MD11) on the first column MDC1 and to the vertical portion 40a of the first-type lower electrode 40A1 (e.g., of the MTJ device MD12) on the second column MDC2, respectively. A pair of contact plugs 34 on the second row MDR2 (See, for example, FIGS. 2A and 5) may be disposed spaced apart from each other at both sides of the isolation gate electrode IG and be connected to the vertical portion 40a of the second-type lower electrode 40A2 (e.g., of the MTJ device MD21) on the first column MDC1 and to the horizontal portion 40b of the second-type lower electrode 40A2 (e.g., of the MTJ device MD22) on the second column MDC2. Accordingly, pairs of contact plugs 34 may be disposed between a pair of word lines WL to constitute first and second columns substantially parallel to the second direction D2. The contact plugs 34 constituting the first column may be alternately connected to the horizontal portions 40b of the first-type lower electrodes 40A1 and the vertical portions 40a of the second-type lower electrodes 40A2, and the contact plugs 34 constituting the second column may be alternately connected to the vertical portions 40a of the first-type lower electrodes 40A1 and the horizontal portions 40b of the second-type lower electrodes 40A2.

The MTJs 50 may be two-dimensionally arranged along the first and second directions D1 and D2 or in rows or columns. The MTJs 50 may be connected to the vertical portions 40a of the lower electrodes 40, respectively. For example, the MTJs 50 may be overlapped with the top surfaces of the lower electrodes 40A1, 40A2 or the top surfaces of the vertical portions 40a. In other words, the MTJs 50 may be disposed to have a zigzag arrangement in the second direction D2 or the longitudinal direction of the word line WL. For example, centers of the MTJs 50 constituting the same column (for example, centers C33 and C43 of the MTJs 50 of the MTJ devices MD33 and MD43) may be offset or spaced apart from each other by a specific distance Dc, when measured in the first direction D1. Further, when viewed in plan view, the MTJs 50 in each row may be arranged on the same line. Accordingly, it is possible to increase an interval between the MTJs 50 (for example, a space dm1 between adjacent ones in the same column, and a space dm2 between adjacent ones in the same row). This makes it possible to increase an integration density of the magnetic memory device 200. Sizes of the MTJs 50 or a design rule of the magnetic memory device 200 may be adjusted to substantially prevent a short circuit from being created between the adjacent MTJs 50 and improve the reliability of the magnetic memory device 200. When viewed in plan view, the MTJs 50 may be disposed in such a way that they are alternately overlapped with the contact plugs 34 in rows and columns.

A method of fabricating the magnetic memory device 200, according to some embodiments of the inventive concept, will be described below.

FIGS. 6A through 10A are plan views illustrating a method of fabricating the magnetic memory device 200, according to some embodiments of the inventive concept. FIGS. 6B and 7B are cross-sectional views taken along dotted lines A-A' or B-B' of FIGS. 6A and 7A, respectively, and FIGS. 6C and 7C are cross-sectional views taken along dotted lines C-C' of FIGS. 6A and 7A, respectively. Further, FIGS. 8B through 10B are cross-sectional views taken along dotted lines dotted lines A-A' of FIGS. 8A through 10A, respectively, and FIGS. 8C through 10C are cross-sectional views taken along dotted lines B-B' of FIGS. 8A through 10A, respectively. FIGS. 8D through 10D are cross-sectional views taken along lines C-C' of FIGS. 8A through 10A, respectively.

Figure 6B:
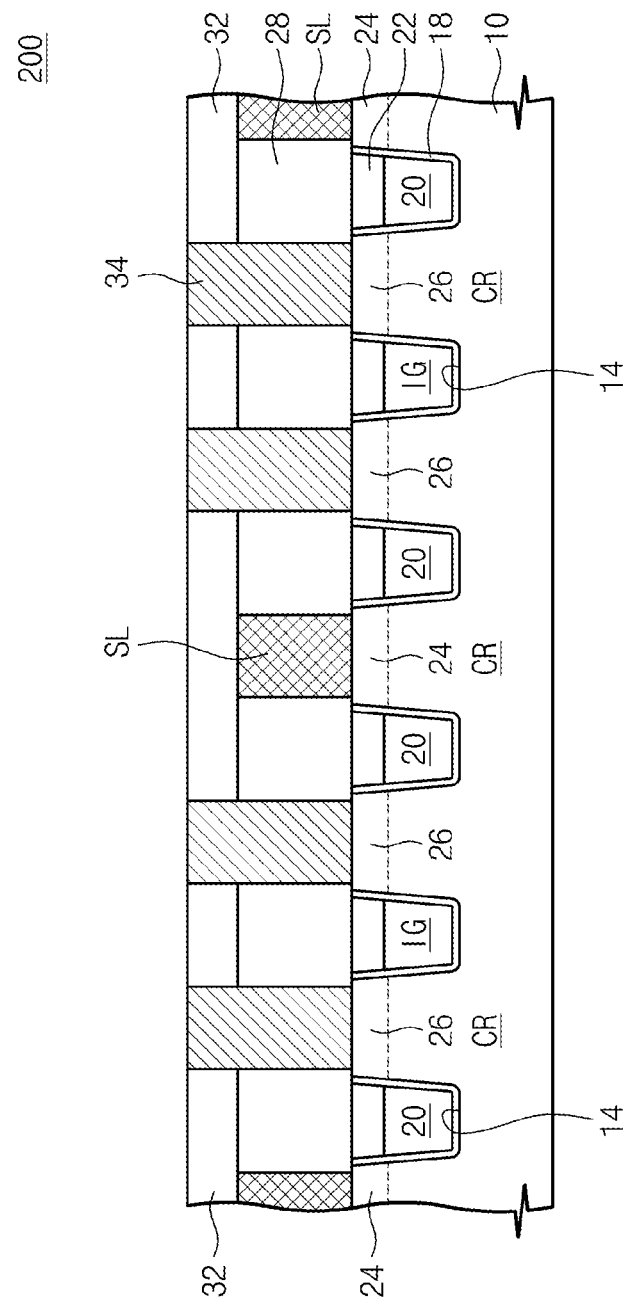
FIGS. 6B and 7B are cross-sectional views taken along dotted lines A-A' or B-B' of FIGS. 6A and 7A, respectively.
Figure 6C:
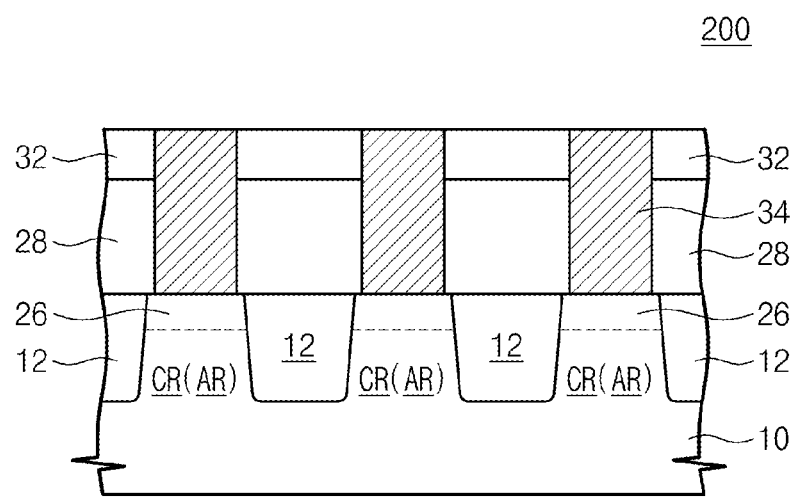
FIGS. 6C and 7C are cross-sectional views taken along dotted lines C-C' of FIGS. 6A and 7A, respectively.

Referring to FIGS. 6A through 6C, field insulating layers 12 may be formed on a semiconductor substrate 10 to define line-shaped active regions AR substantially parallel to a first direction D1. The field insulating layers 12 and the active regions AR may be patterned to form gate trenches 14 extending along a second direction D2 or substantially perpendicular to the first direction D1.

A gate insulating layer 18 may be formed on the gate trenches 14. Thereafter, a conductive layer may be formed to fill the gate trenches 14, and then, be recessed to form cell gate electrodes 20 and isolation gates IG. Each of the cell gate electrodes 20 may constitute the word line WL extending substantially parallel to the second direction D2. Each of the active regions AR may be divided into a plurality of the active portions CR by the isolation gate electrodes IG. Next, capping insulating layers 22 may be formed on the cell and isolation gate electrodes 20 and IG to fill the remaining spaces of the gate trenches 14. The capping insulating layers 22 may be formed to have planarized top surfaces.

Dopants (e.g., of n-type) may be injected into the active portions CR using the capping insulating layers 22 as a mask, and thus, first and second source/drain regions 24 and 26 may be formed in the active portions CR.

A first insulating layer 28 may be formed on the semiconductor substrate 10. Source lines SL substantially parallel to the second direction D2 may be formed in the first insulating layer 28. The source lines SL may be connected to the first source/drain regions 24. A second insulating layer 32 may be formed on the first insulating layer 28, and then, contact plugs 34 may be formed to penetrate the second and first insulating layers 32 and 28. The contact plugs 34 may be connected to the second source/drain regions 26, respectively.

Figure 7A:
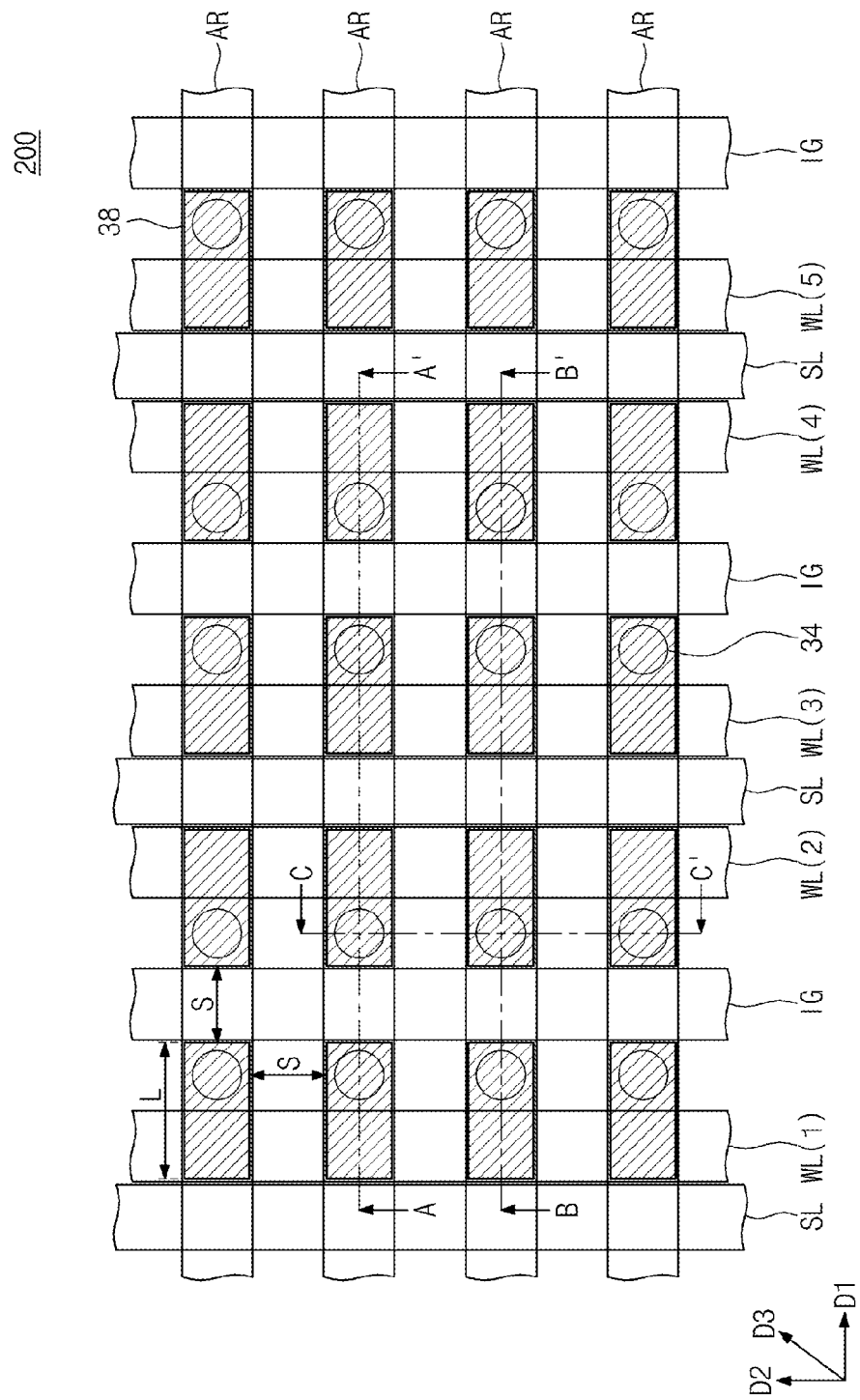
Figure 7B:
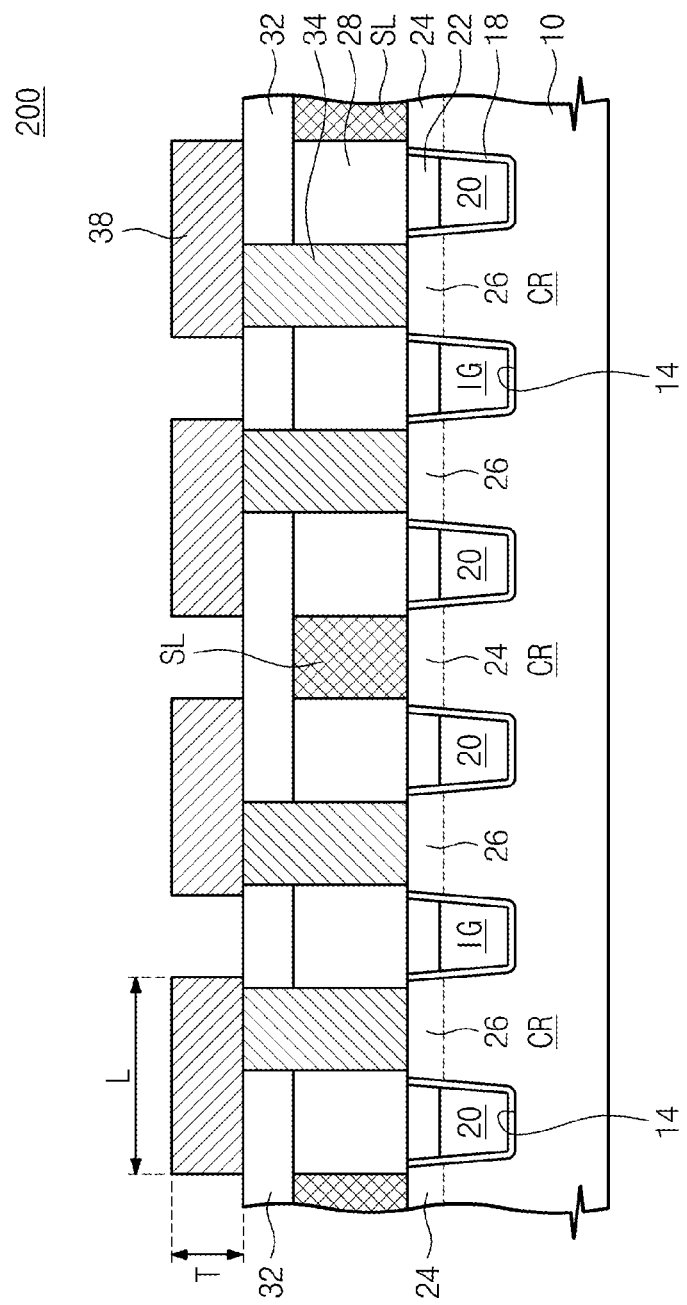
Figure 7C:
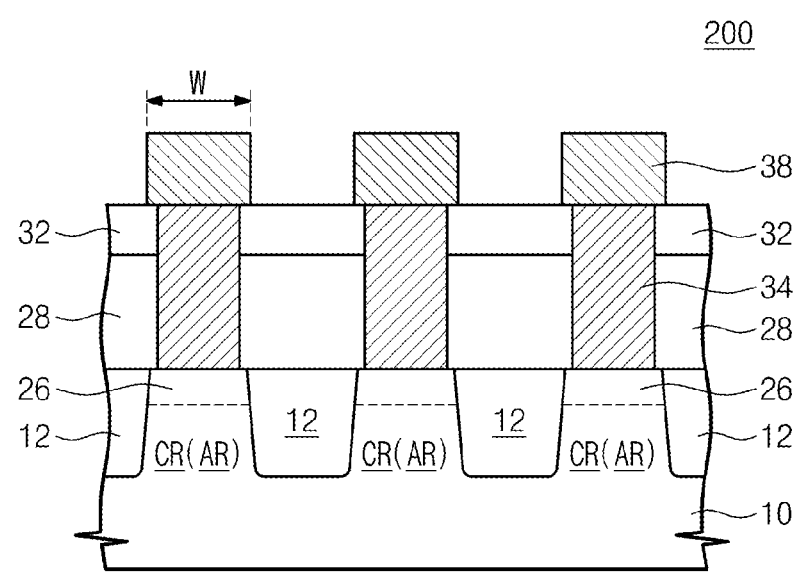

Referring to FIGS. 7A through 7C, a conductive layer may be formed on the second insulating layer 32 provided with the contact plugs 34 and then, be patterned to form preliminary lower electrodes 38.

The preliminary lower electrodes 38 may be connected to the contact plugs 34. When viewed in plan view, the preliminary lower electrodes 38 may be regularly arranged in the first and second directions D1 and D2, and pairs of preliminary lower electrodes 38 may be symmetrically arranged with the isolation gate electrodes IG interposed therebetween. Each of the preliminary lower electrodes 38 may be formed on the active portion CR and, when viewed in plan view, may be shaped like a tetragonal pattern overlapped with the second source/drain region 26 and the word line WL (or the cell gate electrode 20). For example, the preliminary lower electrode 38 may be a pattern, having a length, width, and thickness L, W, and T, respectively. The length L of the preliminary lower electrode 38 may be longer by about 1.2 to about 2.5 times than the width W, but example embodiments of the inventive concepts may not be limited thereto. Here, the length L may be a dimension measured parallel to the first direction D1, and the width W may be a dimension measured parallel to the second direction D2. The preliminary lower electrodes 38 may be spaced apart from each other by a specific space S, for example, in the first and second directions D1 and D2, and be two-dimensionally arranged in rows and columns. For example, the space S between the preliminary lower electrodes 38 may be substantially equal to the width W of the preliminary lower electrode 38. Alternatively, the space S between the preliminary lower electrodes 38 may be a minimum feature size or 1F.

Referring to FIGS. 8A through 8D, the lower electrode mask BM may be formed on the second insulating layer 32 provided with the preliminary lower electrode 38. The lower electrode mask BM may be a pattern extending along the third direction D3, which is at an angle of, for example, about 40 about 80 degrees, to the first direction D1. A width of the lower electrode mask BM may be, for example, about 1.2 to about 2 times of the width W of the preliminary lower electrode 38, but example embodiments of the inventive concepts may not be limited thereto. Since the lower electrode mask BM is formed substantially parallel to the third direction D3, the lower electrode mask BM may partially cover the preliminary lower electrodes 38.

Figure 8A:
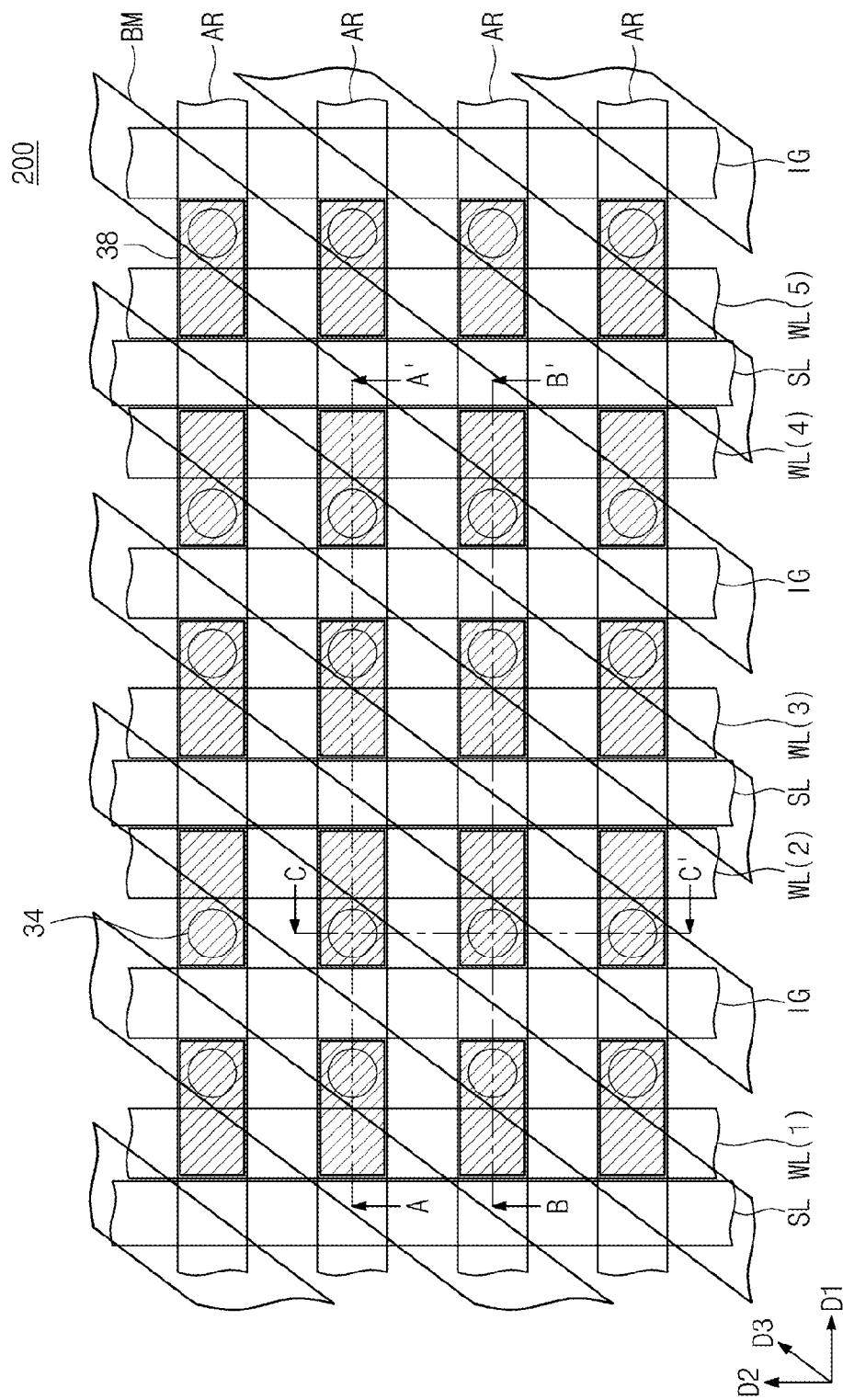
Figure 8B:
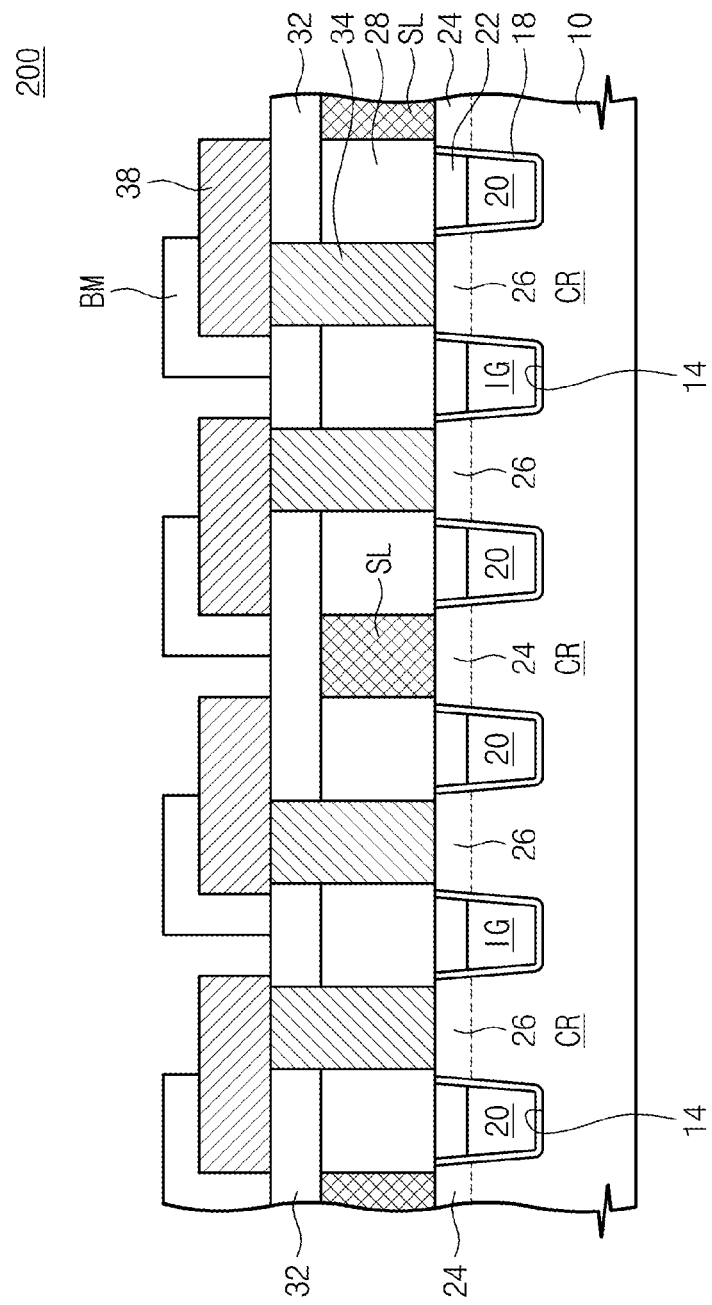
Figure 8C:
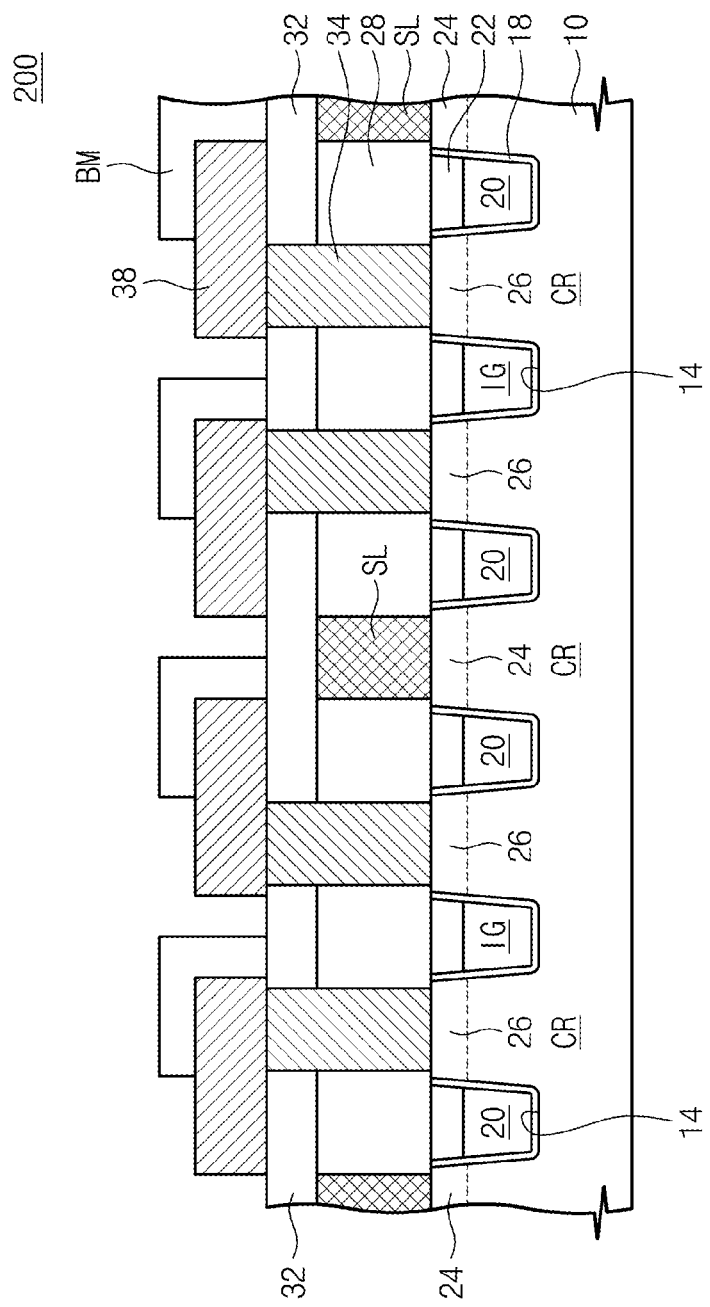
Figure 8D:
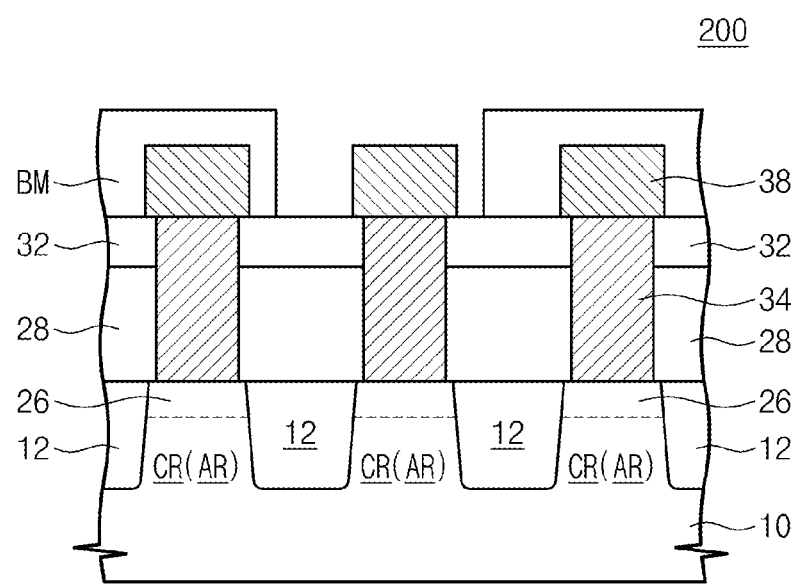
Figure 9A:
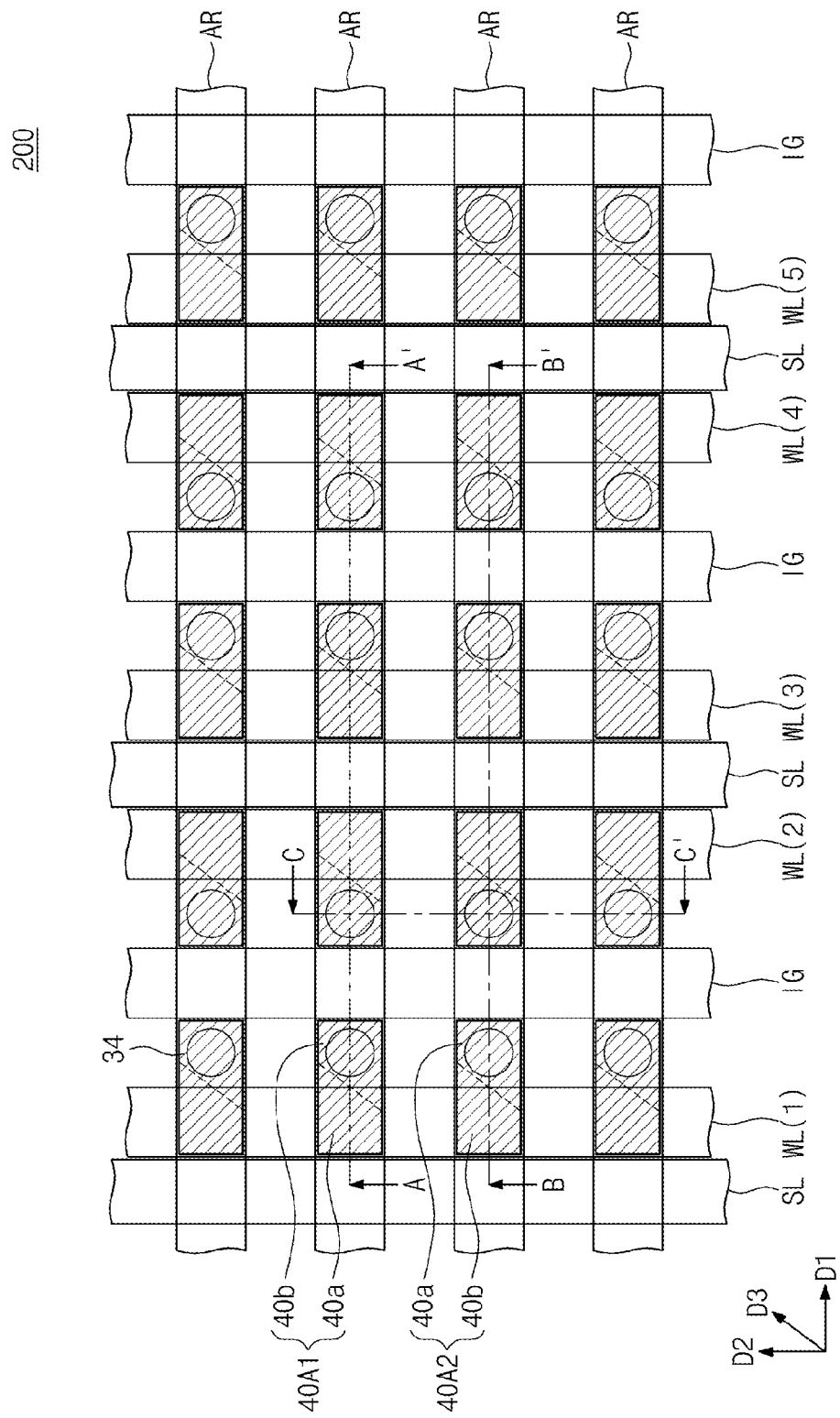
Figure 9B:
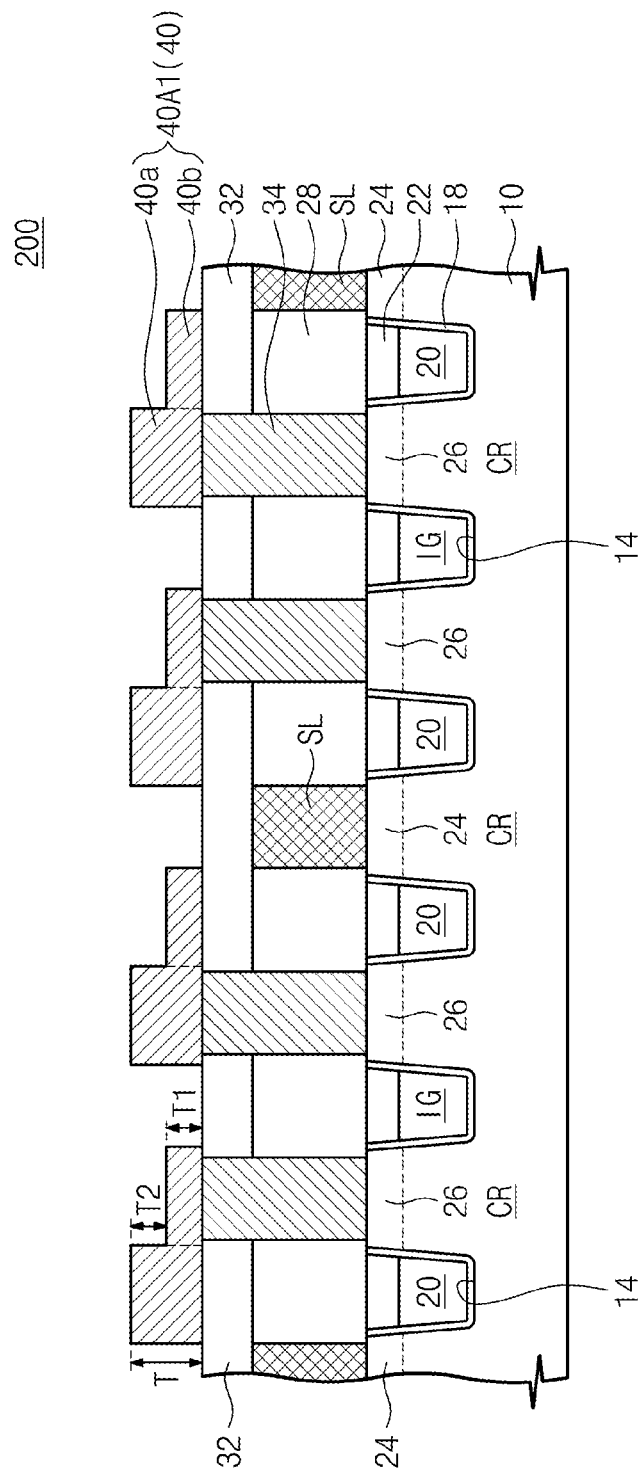
Figure 9C:
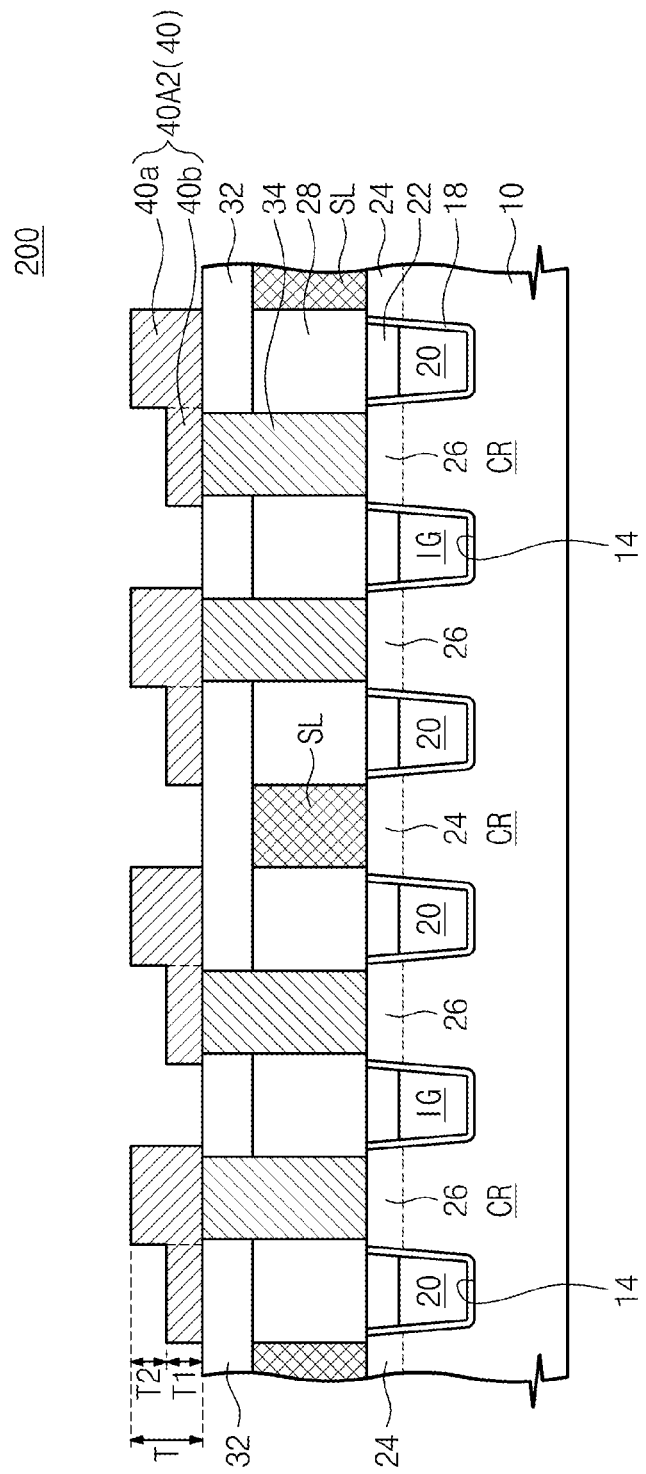
Figure 9D:
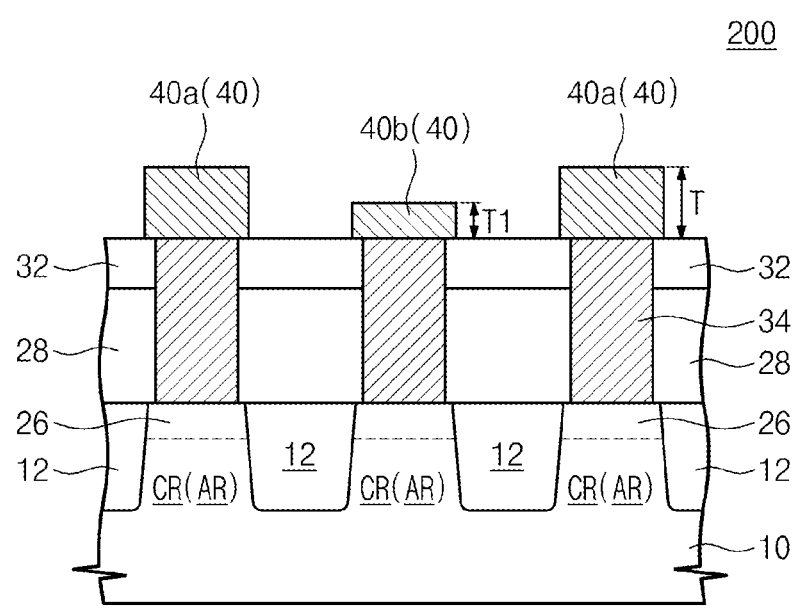
Figure 10A:
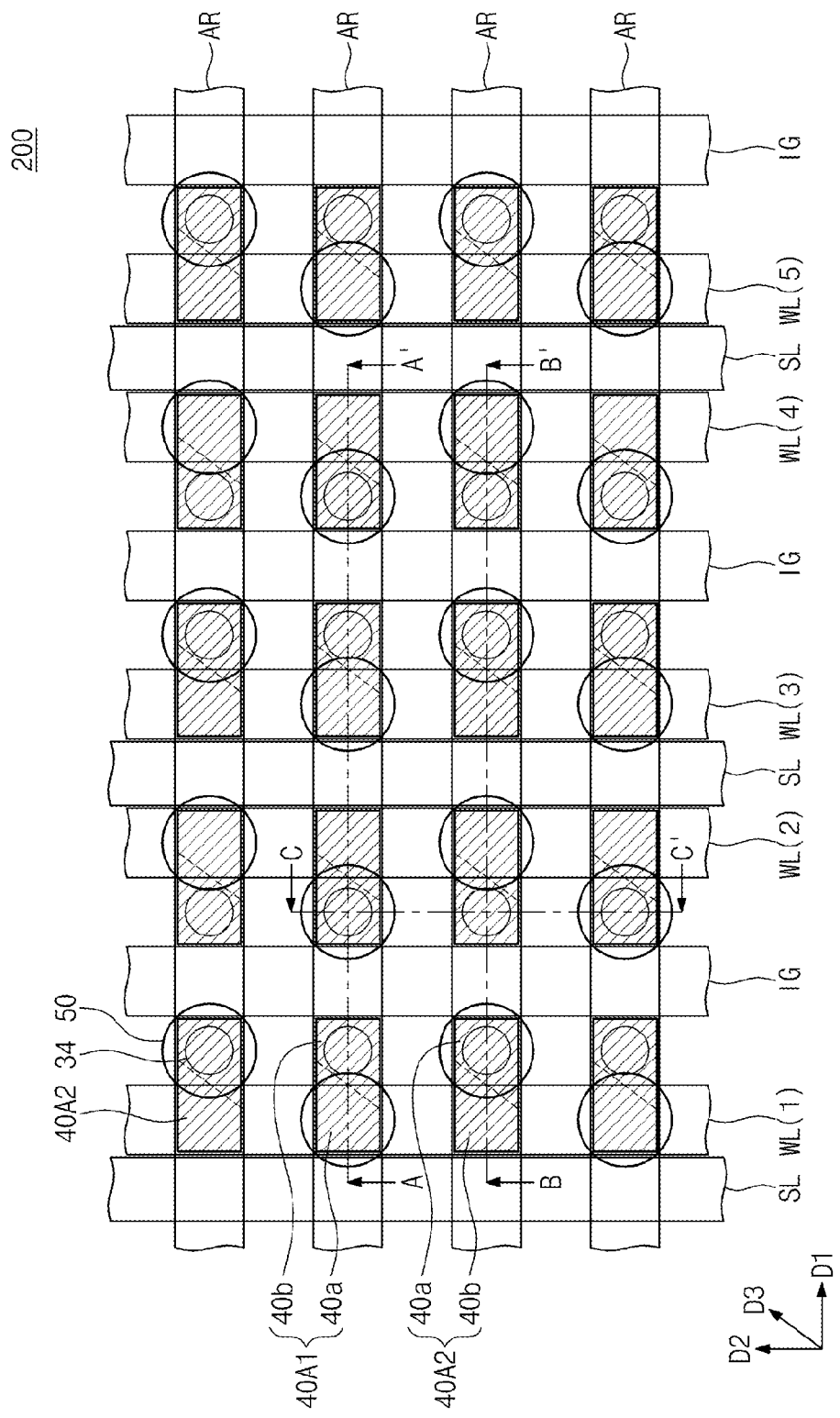
Figure 10B:
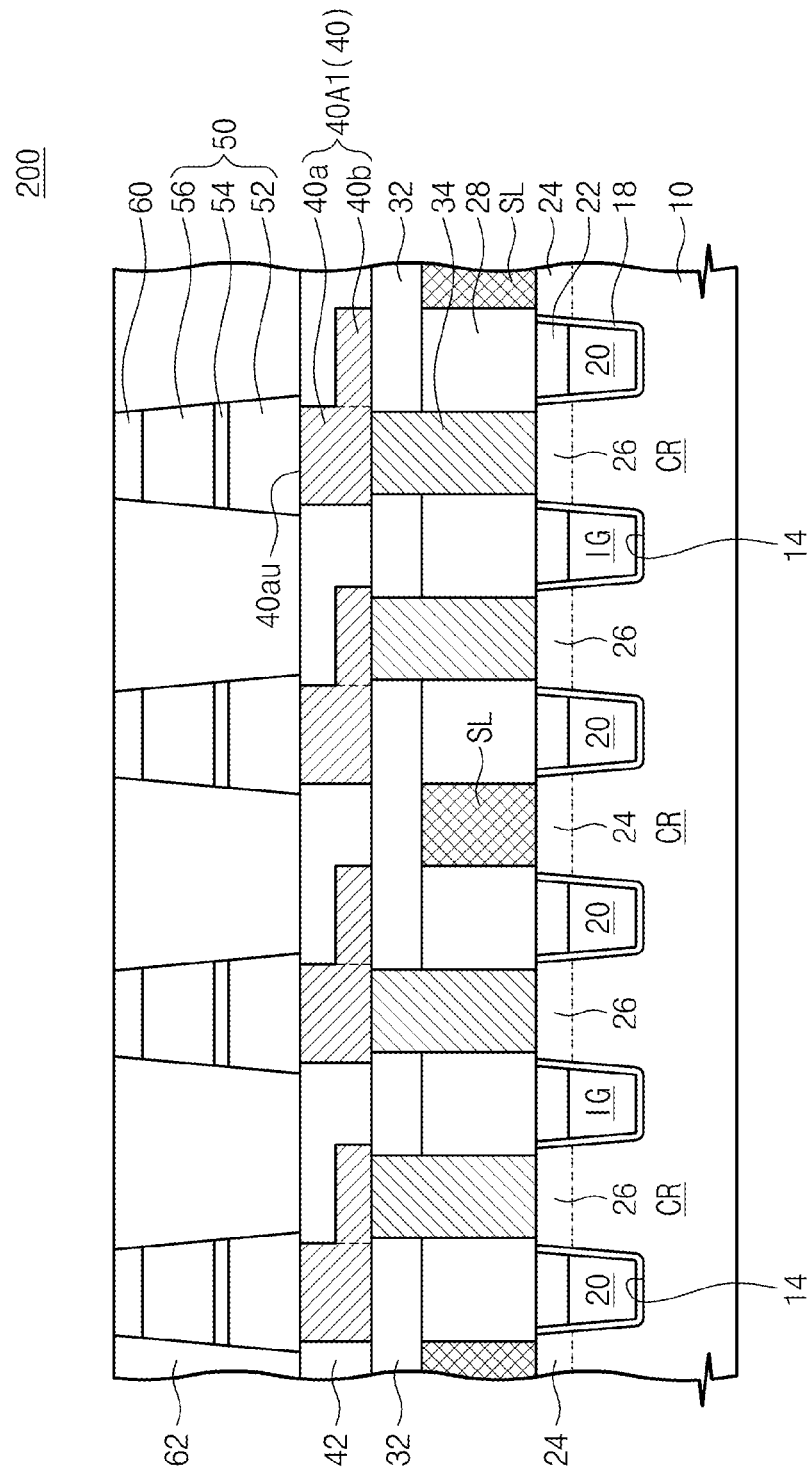
Figure 10C:
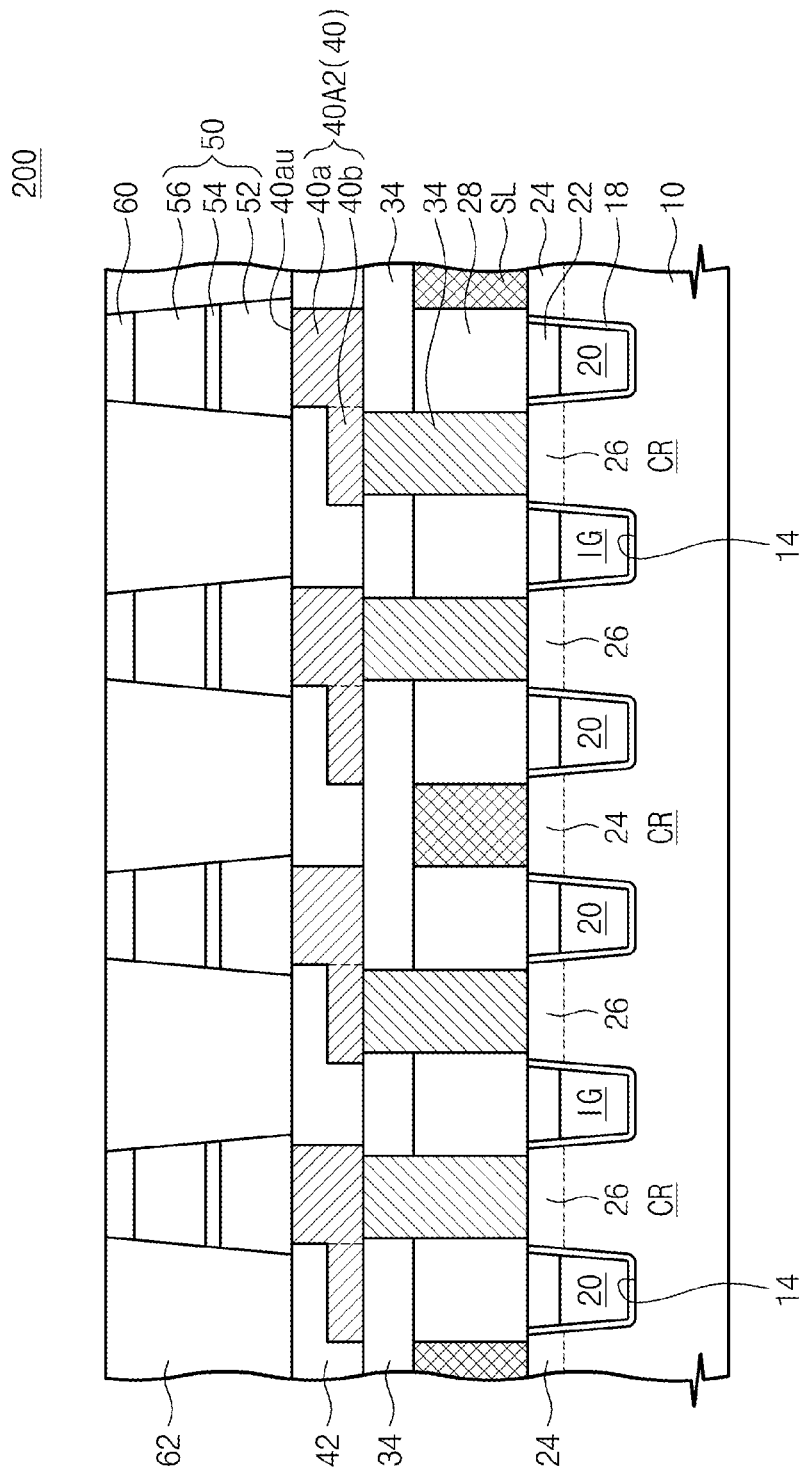
Figure 10D:
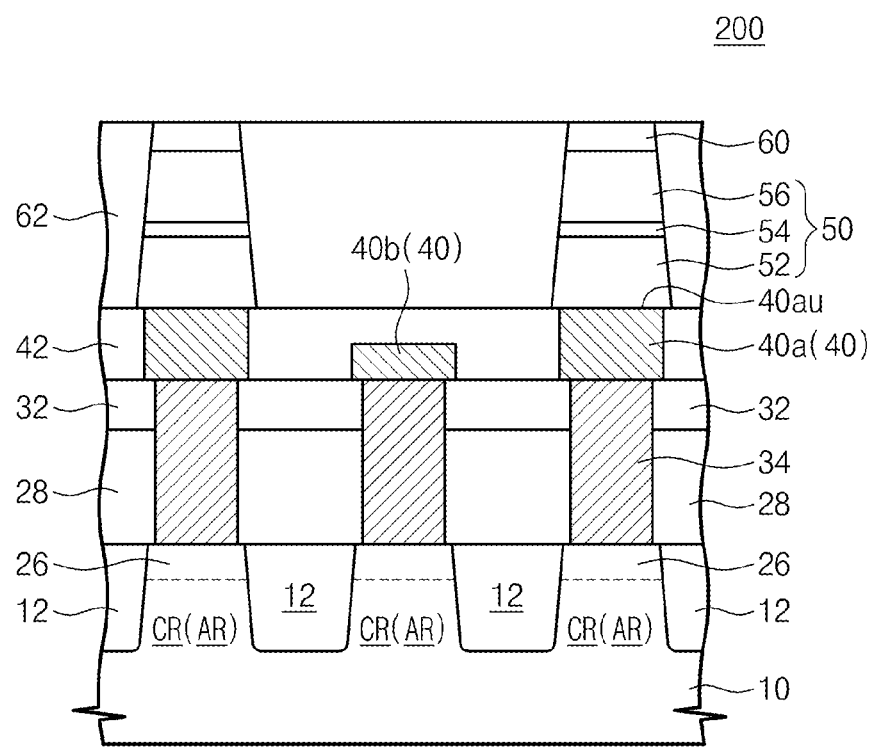

For example, the lower electrode mask BM may cover either left or right portions of the preliminary lower electrodes 38 arranged in the same row. Further, the lower electrode mask BM may alternately expose or cover the left and right portions of the preliminary lower electrodes 38 arranged in the same column. For example, the lower electrode mask BM may be formed to cover left top and side surfaces of the preliminary lower electrodes 38 constituting a specific row, as shown in FIG. 8B, and right top and side surfaces of the preliminary lower electrodes 38 constituting an adjacent row, as shown in FIG. 8C. When viewed along a specific cross-section taken along line C-C', which is parallel to the column, the lower electrode mask BM may be formed to expose a portion of some of the preliminary lower electrodes 38 arranged in the same column and cover portions of the others, as shown in FIG. 8D. The lower electrode mask BM may be formed of, for example, a spin-on-hardmask (SOH) layer. In example embodiments, the SOH layer may be a hydrocarbon-based insulating layer.

Referring to FIGS. 9A through 9D, the preliminary lower electrodes 38 may be etched using the lower electrode mask BM as an etch mask to form the lower electrodes 40, and then, the lower electrode mask BM may be removed. During the etching, the exposed portions of the preliminary lower electrodes 38 may be etched to form a lower electrode 40A1, 40A2 by removing a second thickness T2 of the preliminary lower electrodes 38 such that the resulting lower electrodes 40A1, 40A2 has a first thickness T1. In some embodiments, the first thickness T1 may range from about ¼ to about ¾ of the thickness T of the lower electrode 40A1, 40A2. Accordingly, each of the lower electrodes 40A1, 40A2 may be formed to include the horizontal and vertical portions 40b and 40a, whose thicknesses are the first thickness T1 and the thickness T, respectively. In other words, each of the lower electrodes 40A1, 40A2 may be formed to have an 'L'-shaped section or a laterally inverted 'L'- or ']'-shaped section and to have a polygonal top surface including at least two parallel sides and a side at an angle relative to the parallel sides. The lower electrodes 40A1, 40A2 may be formed to have the structures and arrangement exemplified and described with reference to FIG. 2A through FIG. 5.

Referring to FIGS. 10A through 10D, the third insulating layer 42 may be formed on the second insulating layer 32 and, then, be planarized to cover the horizontal portions 40b of the lower electrodes 40 and to expose the vertical portions 40a. The MTJs 50 may be formed on the third insulating layer 42 to be connected to the vertical portions 40a of the lower electrodes 40, respectively. In some embodiments, the upper electrodes 60 may be formed on the MTJs 50, respectively. For example, a fixed layer, a tunnel barrier layer, a free layer, and a conductive upper electrode layer may be sequentially formed on the third insulating layer 42, and then, be patterned to form the MTJs 50, each of which includes the fixed layer 52, tunnel barrier 54, and the free layer 56, and the upper electrodes 60. The patterning step may be performed in such a way that the MTJs 50 are connected to the top surfaces of the lower electrodes 40 (e.g., the top surfaces of the vertical portions 40a), respectively. In other embodiments, a conductive layer may be additionally formed between the lower electrodes 40 and the fixed layers 52. Each or both of the fixed layer 52 and the free layer 56 may include at least one ferromagnetic material exhibiting a perpendicular or in-plane magnetization property. The tunnel barrier 54 may include at least one of magnesium oxide, titanium oxide, aluminum oxide, magnesium zinc oxide, or magnesium boron oxide.

The MTJ 50 may be a tapered cylindrical structure, whose outer sidewall is slanted at an angle with respect to the top surface of the substrate 10. For example, the MTJ 50 may be formed in such a way that a bottom width of the fixed layer 52 is larger than a top width of the free layer 56. The patterning process for forming the MTJ 50 can be performed while reducing or minimizing an exposed area of the vertical portion 40a of each lower electrode 40A1, 40A2. Thus, it is possible to suppress the lower electrode 40A1, 40A2 from being unintentionally etched. Accordingly, it is possible to suppress an etch residue from being produced from the lower electrode 40A1, 40A2 and thereby to prevent a conductive bridge from being formed between adjacent ones of the MTJ 50 or the lower electrodes 40 thereof. Furthermore, since the etch residue originated from the lower electrode 40A1, 40A2 can be substantially prevented from being deposited on the sidewall of the MTJ 50, it is possible to substantially prevent a short circuit from being created between the free layer 56 and the fixed layer 52. Accordingly, reliability of the magnetic memory device can be improved.

Thereafter, the fourth insulating layer 62 may be formed on the third insulating layer 42 and be planarized to fill gap regions between the MTJs 50 and expose the upper electrodes 60. At least one of the first to fourth insulating layers 28, 32, 42, and 62 may include oxide, nitride, and/or oxynitride. Next, as shown in FIGS. 2A through 2D, the bit lines BL may be formed on the fourth insulating layer 62 to connect the upper electrodes 60 formed in the first direction D1 to each other. In other embodiments, upper electrode contact plugs may be additionally formed between the upper electrodes 60 and the bit lines BL.

Figure 11:
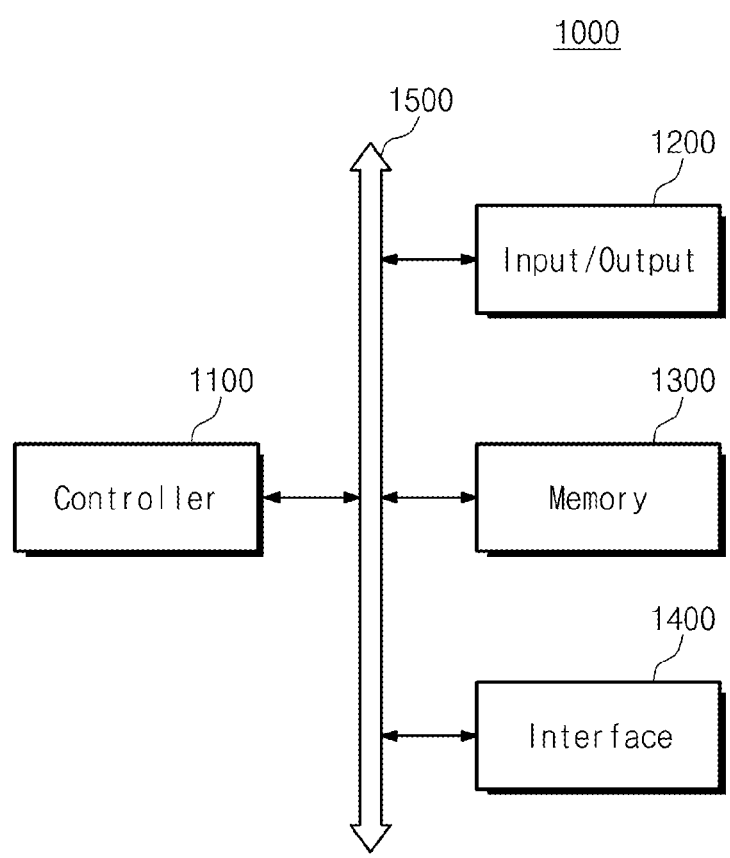
FIG. 11 is a block diagram schematically illustrating an example of electronic systems including a semiconductor device according to example embodiments of the inventive concept.

FIG. 11 is a block diagram schematically illustrating an example of electronic systems including at least one of magnetic memory devices according to example embodiments of the inventive concept.

Referring to FIG. 11, an electronic system 1000 according to example embodiments of the inventive concept may include a controller 1100, an input/output (I/O) unit 1200, a memory device 1300, an interface unit 1400 and a data bus 1500. At least two of the controller 1100, the I/O unit 1200, the memory device 1300 and the interface unit 1400 may communicate with each other through the data bus 1500. The data bus 1500 may correspond to a path through which electrical signals are transmitted.

The controller 1100 may include at least one of a microprocessor, a digital signal processor, a microcontroller or another logic device. The other logic device may have a similar function to any one of the microprocessor, the digital signal processor and the microcontroller. The I/O unit 1200 may include a keypad, a keyboard or a display unit. The memory device 1300 may store data and/or commands. The memory device 1300 may include at least one of the above-described magnetic memory devices. The interface unit 1400 may transmit electrical data to a communication network or may receive electrical data from a communication network. The interface unit 1400 may operate by wireless or cable. For example, the interface unit 1400 may include an antenna for wireless communication or a transceiver for cable communication. Although not shown in the drawings, the electronic system 1000 may further include at least one of the above-described magnetic memory devices, a fast DRAM device, and/or a fast SRAM device that acts as a cache memory for improving an operation of the controller 1100.

The electronic system 1000 may be applied to a personal digital assistant (PDA), a portable computer, a web tablet, a wireless phone, a mobile phone, a digital music player, a memory card or an electronic product. The electronic product may receive or transmit information data by wireless.

According to example embodiments of the inventive concept, the magnetic memory device may include the lower electrodes that are disposed spaced apart from each other by an allowable minimum space. Accordingly, it is possible to prevent a short circuit from being established between the MTJs and to increase an integration density of the magnetic memory device.

Further, the lower electrodes may be formed to have an allowable minimum area, and thus, it is possible to suppress an etch residue from being produced from the lower electrode during a patterning process for forming the MTJ. Accordingly, a conductive bridge can be prevented from being formed between the lower electrodes adjacent to each other, and in each MTJ, the free layer can be prevented from being vertically connected to the fixed layer. This makes it possible to improve reliability of the magnetic memory device.

While example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device, comprising:
a plurality of word lines;
a plurality of bit lines crossing the word lines;
lower electrodes arranged two-dimensionally below the bit lines and on the word lines, wherein each of the lower electrodes comprises vertical and horizontal portions having different thicknesses from each other;
MTJs provided on the vertical portions of the lower electrodes, respectively; and
upper electrodes provided on the MTJs, respectively,
wherein the lower electrodes comprises first-type lower electrodes positioned below odd-numbered ones of the bit lines and second-type lower electrodes positioned below even-numbered ones of the bit lines, and
when viewed in plan view, centers of the vertical portions of the first-type lower electrodes are overlapped with odd-numbered ones, respectively, of the word lines, and centers of the vertical portions of the second-type lower electrodes are spaced apart from the odd-numbered ones of the word lines.

2. The magnetic memory device of claim 1, wherein, when viewed in plan view, the centers of the vertical portions of the second-type lower electrodes are overlapped with even-numbered ones, respectively, of the word lines, and the centers of the vertical portions of the first-type lower electrodes are spaced apart from the even-numbered ones of the word lines.

3. The magnetic memory device of claim 2, wherein each of adjacent pairs of the first- and second-type lower electrodes are provided to have rotational symmetry with respect to a point therebetween.

4. The magnetic memory device of claim 2, wherein the vertical portion of each of the lower electrodes has a top surface that is higher than that of the horizontal portion of each of the lower electrodes and includes at least first and second sides substantially parallel to each other and a third side at an angle to the first and second sides.

5. The magnetic memory device of claim 4, wherein the third side is slanted at an angle of between about 40 to about 80 degrees to the bit line.

6. The magnetic memory device of claim 4, wherein all of the third sides are substantially parallel to each other.

7. The magnetic memory device of claim 4, wherein the lower electrodes constitute a plurality of groups, which are grouped in such a way that the third sides of the lower electrodes are arranged along a substantially same diagonal line, and
when viewed in plan view, each of the groups include the lower electrodes that are positioned on different ones of the word lines and below different even-numbered ones of or different odd-numbered ones of the bit lines.

8. The magnetic memory device of claim 4, further comprising contact plugs provided below the lower electrodes, respectively, and
wherein the contact plugs are arranged to provide first and second columns substantially parallel to the word line, between a pair of adjacent word lines.

9. The magnetic memory device of claim 8, wherein the contact plugs are provided in such a way that ones arranged in the first column are alternately connected to the horizontal portions of the first-type lower electrodes and the vertical portions of the second-type lower electrodes, and that ones arranged in the second column are alternately connected to the vertical portions of the first-type lower electrodes and the horizontal portions of the second-type lower electrodes.

10. The magnetic memory device of claim 2, wherein, when viewed in plan view, the first-type lower electrodes are provided in such a way that centers of the vertical portions thereof are overlapped with the odd-numbered ones, respectively, of the word lines, and centers of the horizontal portions thereof are overlapped with the even-numbered ones, respectively, of the word lines.

11. The magnetic memory device of claim 10, wherein, when viewed in plan view, the second-type lower electrodes are provided in such a way that centers of the horizontal portions thereof are overlapped with the odd-numbered ones, respectively, of the word lines, and centers of the vertical portions thereof are overlapped with the even-numbered ones, respectively, of the word lines.

12. The magnetic memory device of claim 1, wherein each of the MTJs comprises a free layer, a tunnel barrier, and a fixed layer, and is a tapered cylindrical structure, whose outer sidewall is slanted at an angle to a top surface of the bit line.

13. The magnetic memory device of claim 1, wherein configuration of the vertical portions of the first-type and second-type lower electrodes form an alternating and repeating pattern, respectively, with vertical portions of the first-type lower electrodes arranged in alternating rows being located along one line, and vertical portions of the second-type lower electrodes arranged in alternating rows other than the first-type lower electrodes being located along a different line.

* * * * *